US012609150B2

(12) United States Patent
Sajedi Alvar

(10) Patent No.: US 12,609,150 B2
(45) Date of Patent: Apr. 21, 2026

(54) MEMORY CELL ARRANGEMENTS AND METHOD OF OPERATING A MEMORY CELL

(71) Applicant: Ferroelectric Memory GmbH, Dresden (DE)

(72) Inventor: Mohammad Sajedi Alvar, Dresden (DE)

( * ) Notice: Subject to any disclaimer, the term of this patent is extended or adjusted under 35 U.S.C. 154(b) by 88 days.

(21) Appl. No.: 18/662,013

(22) Filed: May 13, 2024

(65) Prior Publication Data

US 2025/0349335 A1 Nov. 13, 2025

(51) Int. Cl.
*G11C 11/22* (2006.01)

(52) U.S. Cl.
CPC ........ *G11C 11/2259* (2013.01); *G11C 11/221* (2013.01); *G11C 11/2273* (2013.01); *G11C 11/2275* (2013.01)

(58) Field of Classification Search
CPC .............. G11C 11/2259; G11C 11/221; G11C 11/2273; G11C 11/2275
See application file for complete search history.

(56) References Cited

PUBLICATIONS

Wang, Q.; Zhang, D.; Zhao, Y.; Liu, C.; Hu, Q.; Liu, X.; Yang, J.; Lv, H. A 1T2C FeCAP-Based In-Situ Bitwise X(N)OR Logic Operation with Two-Step Write-Back Circuit for Accelerating Compute-In-Memory. Micromachines 2021, 12, 385. https://doi.org/10.3390/mi12040385.*

* cited by examiner

*Primary Examiner* — Xiaochun L Chen
(74) *Attorney, Agent, or Firm* — Natalie Albrecht

(57) ABSTRACT

Memory cell arrangements and methods of operating a memory cell are disclosed, wherein a memory cell arrangement includes a memory cell including: a field-effect transistor including a gate terminal, a first source/drain terminal, and a second source/drain terminal; and a spontaneously-polarizable capacitor connected to the first source/drain terminal of the field-effect transistor, the spontaneously-polarizable capacitor having a first capacitance; and a write modification circuit electrically conductively connected to the second source/drain terminal or to the spontaneously-polarizable capacitor, wherein the write modification circuit includes a write capacitor having a second capacitance and wherein the write modification circuit is configured to selectively provide the second capacitance when the memory cell is written.

20 Claims, 15 Drawing Sheets

602 applying one or more voltages to the memory cell to write a spontaneously-polarizable capacitor of the memory cell into a memory state while one or more write capacitors are charged to provide a second capacitance, thereby generating a capacitive voltage divider based on the first capacitance and the second capacitance

702 applying one or more voltages to the memory cell to read a memory state of a spontaneously-polarizable capacitor of the memory cell while one or more write capacitors being electrically conductively connected to the memory cell in series with spontaneously-polarizable capacitor are not charged

802 switching between a write-operation mode and a read-operation mode, wherein one or more write capacitors, which are electrically conductively connected in series with the spontaneously-polarizable capacitor, are charged in the write-operation mode and are not charged in the read-operation mode

MEMORY CELL ARRANGEMENTS AND METHOD OF OPERATING A MEMORY CELL

TECHNICAL FIELD

Various aspects relate to memory cell arrangements and methods of operating (e.g., writing and/or reading) a memory cell.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained (read out) by determining in which of the memory states the memory cell is residing in. At present, various types of memory cells may be used to store data. By way of example, a type of memory cell may include a thin film of a spontaneous-polarizable material, e.g., a ferroelectric material or a configuration of an anti-ferroelectric material, whose polarization state may be changed in a controlled fashion to store data in the memory cell, e.g., in a non-volatile manner. A memory cell or an arrangement of memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 6 to FIG. 8 each show a flow diagram of a method for operating (e.g., writing and/or reading) a memory cell according to various aspects.

DESCRIPTION

Figure 1:
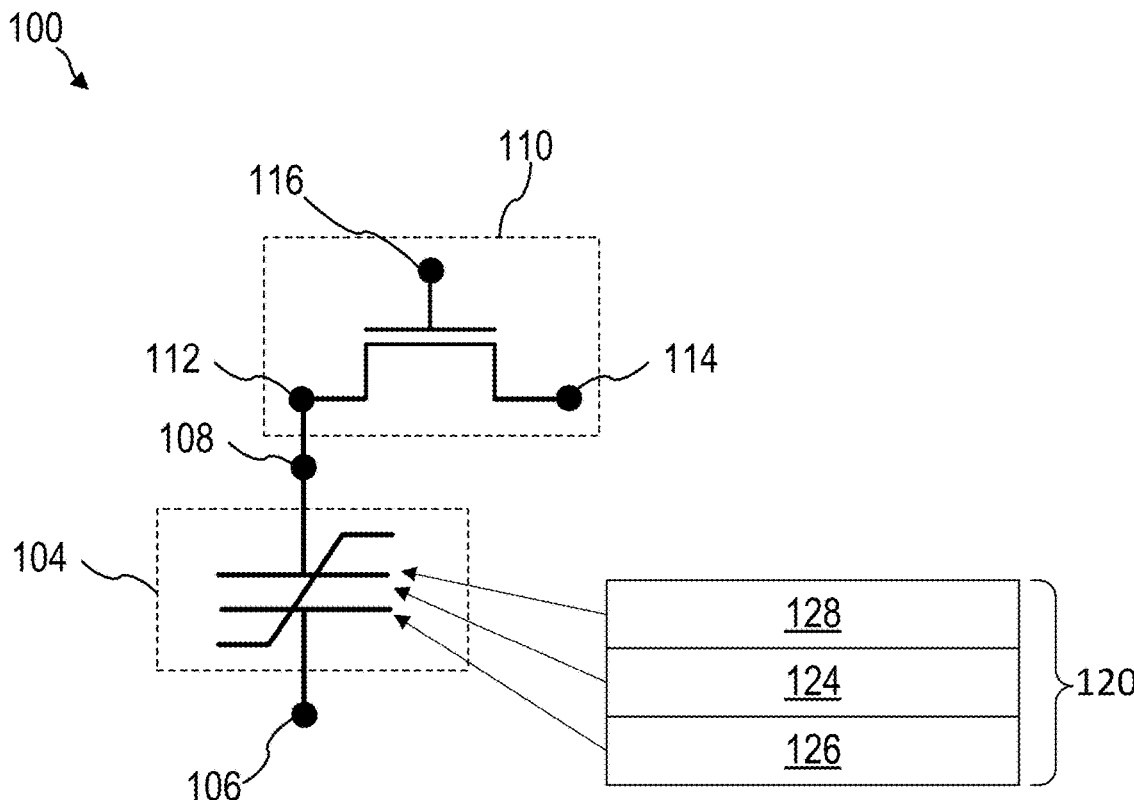
FIG. 1 shows an equivalent circuit of a memory cell according to various aspects.
Figure 2A:
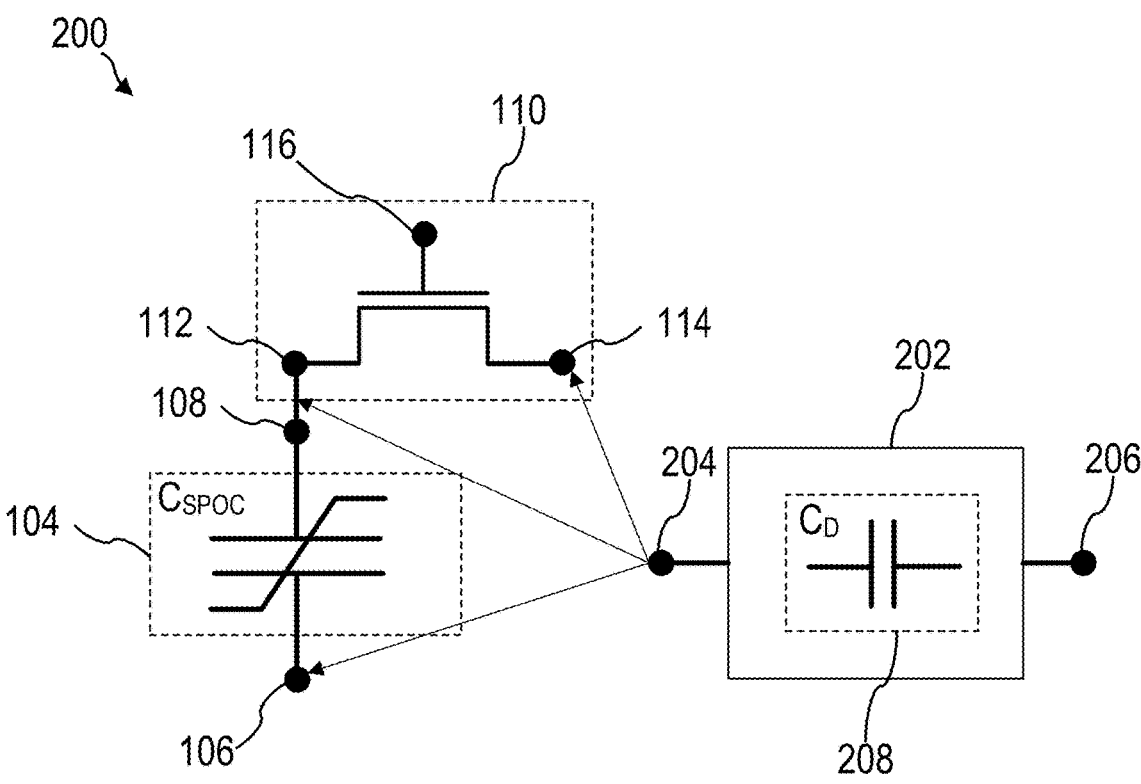
FIG. 2A to FIG. 2D each show an equivalent circuit and various aspects of a memory cell arrangement which includes a write modification circuit according to various aspects.
Figure 2B:
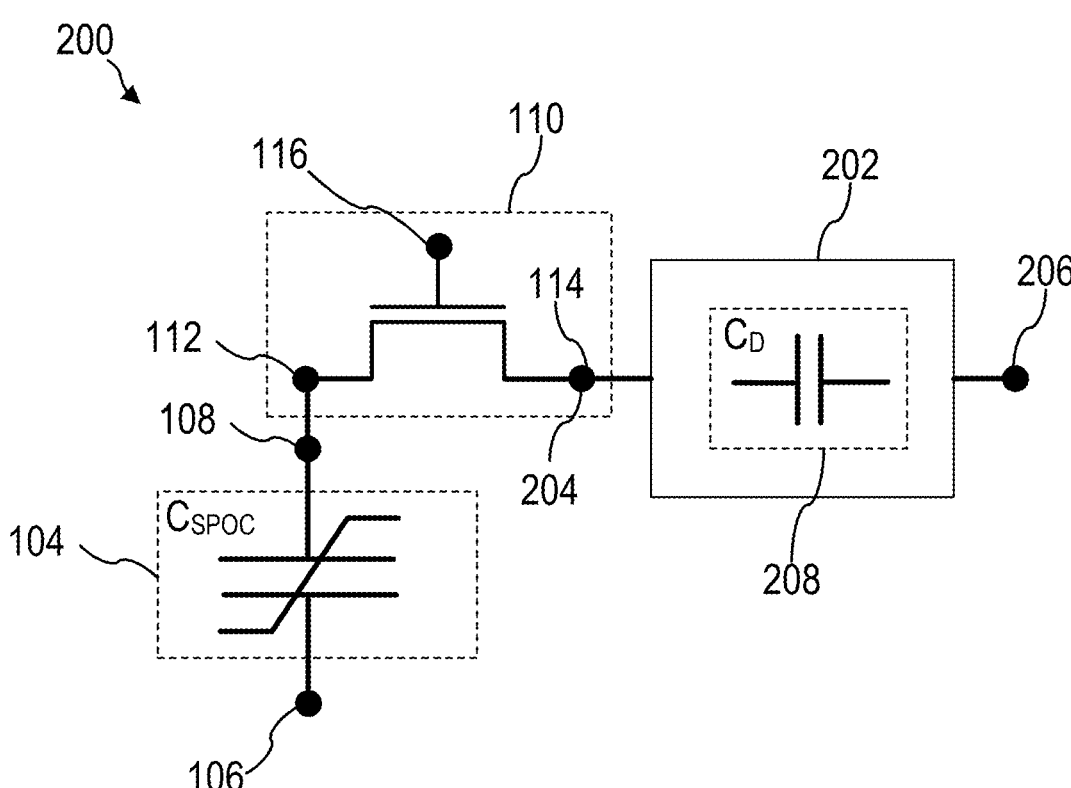
Figure 2C:
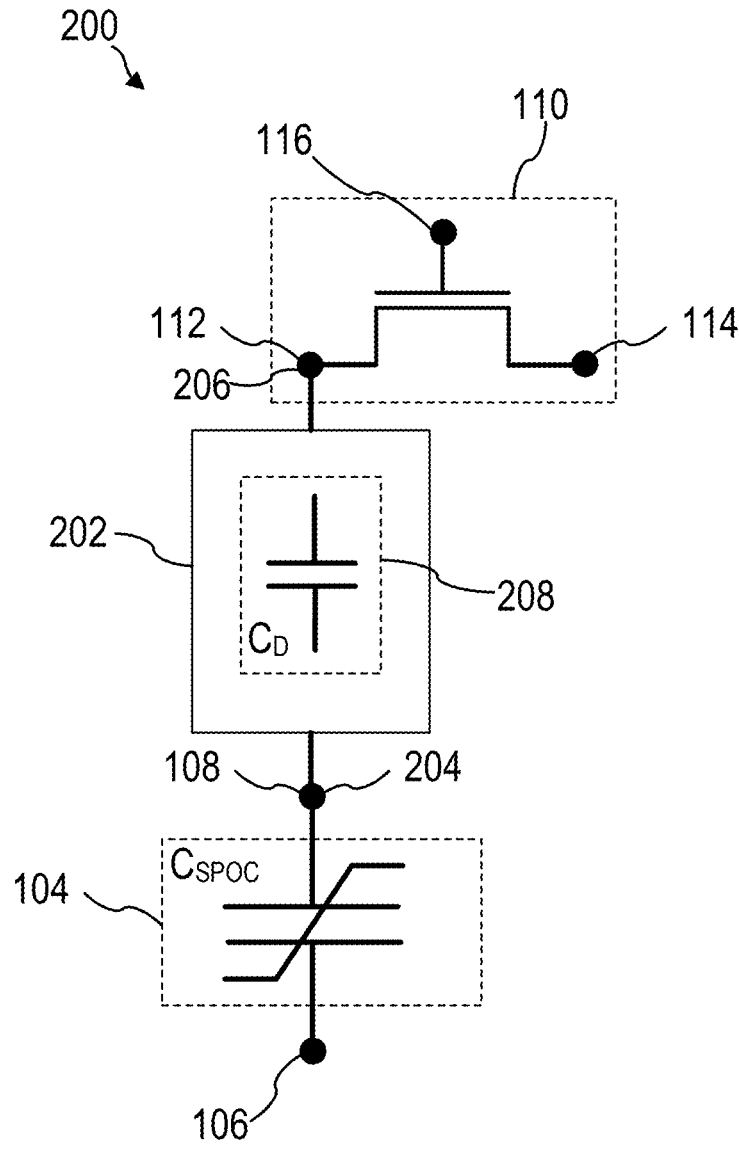
Figure 2D:
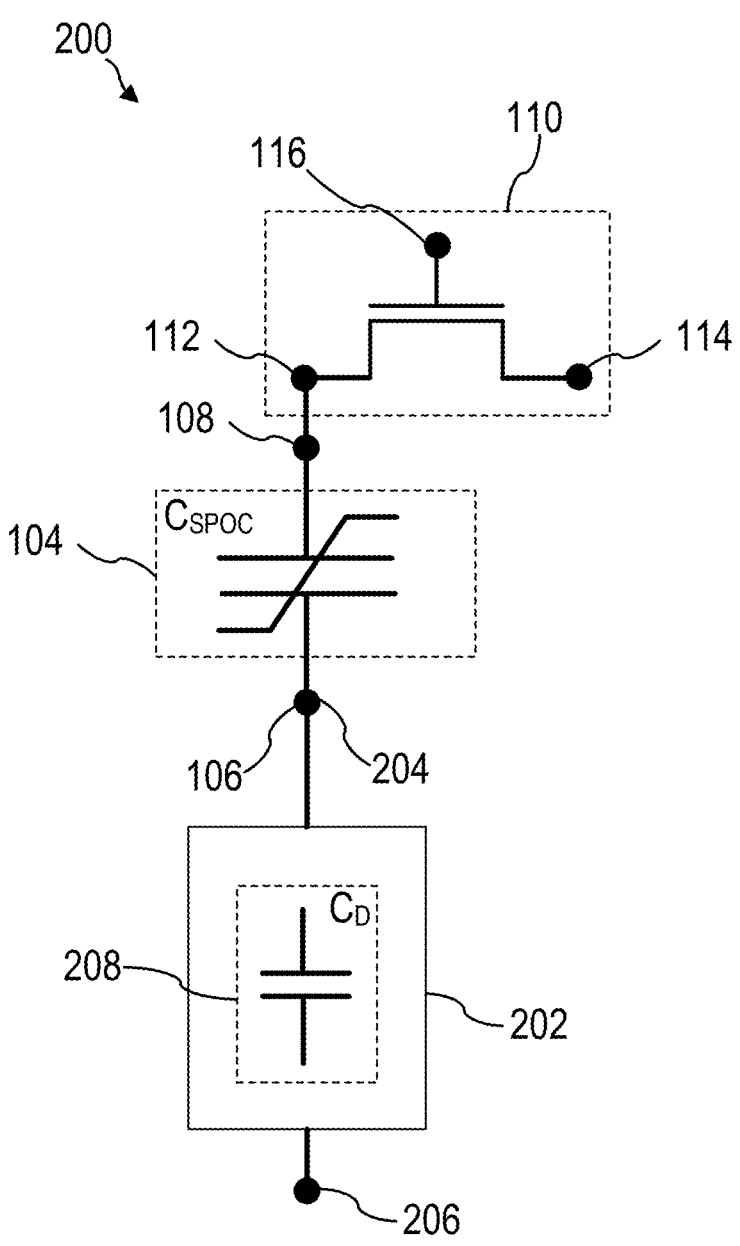

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

Various memory devices include memory cells which can be written into two different memory states, usually referred to as logic "1" and logic "0". For various kinds of applications, such as artificial intelligence (e.g., neuromorphic) applications, and memory technologies, such as a (e.g., high-density) multi-bit storage, it may be desirable to have memory cells which is writable into more than two (e.g., three or more than three) memory states.

Various aspects described herein refer to a memory cell which can be written into one of three or more than three memory states. In particular, a memory cell is provided having a spontaneously-polarizable (e.g., ferroelectric) capacitor which can be written (by changing the polarization of a spontaneously-polarizable portion thereof) in a linear manner, thereby providing a plurality of possible memory states (and, thus, a multi-bit storage capability).

This linear relation between the polarization of the spontaneously-polarizable portion of the spontaneously-polarizable (e.g., ferroelectric) capacitor and the voltage applied over the spontaneously-polarizable (e.g., ferroelectric) capacitor during writing can be achieved by providing an additional (second) capacitance during writing but not during reading the memory cell.

Various aspects relate to a memory cell arrangement including: a memory cell including: a field-effect transistor, FET, including a gate terminal, a first source/drain terminal, and a second source/drain terminal, and a spontaneously-polarizable capacitor connected to the first source/drain terminal of the field-effect transistor, the spontaneously-polarizable capacitor having a first capacitance; and a write modification circuit connected to the second source/drain terminal or to the spontaneously-polarizable capacitor, wherein the write modification circuit includes a write capacitor having a second capacitance and wherein the write modification circuit is configured to selectively provide the second capacitance when the memory cell is written but not when the memory cell is read, thereby allowing to generate, when the memory cell is written, a capacitive voltage divider based on the first capacitance and the second capacitance.

FIG. 1 shows an equivalent circuit of a memory structure 100 according to various aspects. The memory structure 100 may include a capacitive memory structure, such as a spontaneously polarizable capacitor, SPOC, structure 120. The SPOC structure 120 (in some aspects also referred to as memory layer stack) may include at least two electrodes (e.g., two electrode layers), such as a first electrode 126 and a second electrode 128. The SPOC structure 120 may include a memory element 124. The memory element 124 may be disposed between the first electrode 126 and the second electrode 128. The memory element 124 may be disposed in direct physical contact with the first electrode 126 and in direct physical contact with the second electrode 128. The memory element 124 may include or may consist of a spontaneously polarizable material. A memory element including or consisting of a spontaneously polarizable material may also be referred to as spontaneously-polarizable memory element 124. For example, the spontaneously polarizable material may be a remanent polarizable material, such as a ferroelectric material, or a non-remanent polarizable material, such as an anti-ferroelectric material. A memory element including or consisting of a spontaneously polarizable material may be understood such that the memory element has (e.g., within the framework of the SPOC structure 120) spontaneously polarizable properties. According to various aspects, the first electrode 126, the second electrode 128, and the memory element 124 may form the SPOC structure 120. The SPOC structure 120 may provide a spontaneously polarizable capacitor (SPOC) 104 (in some aspects also referred to as memory capacitor). The first electrode 126 may be coupled to a first SPOC terminal 106 and the second electrode 128 may be coupled to a second SPOC terminal 108. The second SPOC terminal 108 may be connected to the first source/drain terminal 112 of the FET structure 110. The first electrode 126, the memory element 124, and the second electrode 128 may form a memory capacitor layer stack. In some aspects, the memory capacitor layer stack may be a planar layer stack; however, other shapes may be suitable as well, e.g., curved shapes, angled shapes, coaxially aligned shapes, as examples. Illustratively, the SPOC structure 120 may include planar electrodes, or, in other aspects, the SPOC structure 120 may be configured as 3D capacitor including, for example, angled or curved electrodes.

A material of the first electrode 126 and/or of the second electrode 128 may have an electrical conductivity greater than $10^6$ S/m at a temperature of 20° C. The first electrode 126 and/or the second electrode 128 may have a thickness less than 10 nm, for example less than 5 nm, for example less than 2 nm. The coefficient of thermal expansion of the first electrode 126 and/or the second electrode 128 may be below 7 ppm.

The first electrode 126 and/or the second electrode 128 may include or may consist of a metal, such as Copper (Cu), Platinum (Pt), Iridium (Ir), Rhenium (Re), Rhodium (Rh), Palladium (Pd), Ruthenium (Ru), Titanium (Ti), Osmium (Os), Molybdenum (Mo), Chromium (Cr), Tungsten (W), Silver (Ag), Aluminum (Al), Gold (Au), Cobalt (Co).

The first electrode 126 and/or the second electrode 128 may include or may consist of a metal nitride. The metal nitride may be, for example, a titanium-based alloy (e.g., TiN, e.g., Ti—C—N, e.g., Ti—Al—N, e.g., TiN—TaN), a tantalum-based alloy (e.g., TaN, e.g., Ta—C—N, e.g., TaN—TiN), or a tungsten-based nitride (e.g., WN).

The first electrode 126 and/or the second electrode 128 may include or may consist of an oxidation resistant metal (e.g., a noble metal). The oxidation resistant metal may have an electronegativity greater than 1.85 on the Pauling scale. The oxidation resistant metal may have a melting temperature greater than 1450° C. This may reduce an oxidation of the interface of the respective electrically conductive electrode layer. The oxidation resistant metal may include (e.g., consist of), for example, tungsten, platinum, iridium, ruthenium, palladium, osmium, rhodium, molybdenum, cobalt, rhenium, or nickel. According to various aspects, the first electrode 126 and/or the second electrode 128 may have a work function of the oxidation resistant metal equal to or greater than 5 eV. According to various aspects, using oxidation resistant metal electrode(s) in combination with a spontaneously polarizable material which includes transition-metal-oxides (e.g., as a high-k capacitor dielectric) may suppress a charge injection due to the work function equal to or greater than 5 eV and a comparatively high band-offset. The band-offset may be a conduction band-offset for electrons (between Fermi-level of the electrode and the conduction band of the dielectric layers) or a valance band offset for holes (between Fermi-level of the electrode and the valence band of the dielectric layers).

The first electrode 126 and/or the second electrode 128 may include or may consist of a metal oxide, such as tungsten oxide.

A spontaneously polarizable material (e.g., HZO) of the spontaneously polarizable memory layer stack may exhibit the spontaneously polarizable properties only in the crystalline phase. According to some aspects, the spontaneously polarizable material may be deposited already in the crystallized state. According to other aspects, the spontaneously polarizable material may be deposited substantially amorphous and crystallized afterwards. Hence, herein the material of the memory element 124 may be referred to as spontaneously polarizable material even in the amorphous state prior to exhibiting the spontaneously polarizable properties responsive to crystallization.

The spontaneously-polarizable memory element 124 may show a hysteresis in the (voltage (drop) dependent) polarization. The spontaneously-polarizable memory element 124 may show non-remanent spontaneous polarization (e.g., may show anti-ferroelectric properties), e.g., the spontaneously-polarizable memory element may have no or no substantial remanent polarization remaining in the case that no voltage drops over the spontaneously-polarizable memory element 124. In other aspects, the spontaneously-polarizable memory element 124 may show remanent spontaneous polarization (e.g., may show ferroelectric properties), e.g., the spontaneously-polarizable memory element 124 may have a remanent polarization or a substantial remanent polarization remaining in the case that no voltage drops over the spontaneously-polarizable memory element.

The terms "spontaneously polarized" or "spontaneous polarization" may be used herein, for example, with reference to the polarization capability of a material beyond dielectric polarization. A "spontaneously-polarizable" (or "spontaneous-polarizable") material may be or may include a spontaneously-polarizable material that shows a remanence, e.g., a ferroelectric material, and/or a spontaneously-polarizable material that shows no remanence, e.g., an anti-ferroelectric material. The coercivity of the spontaneously-polarizable material may be a measure of the strength of the reverse polarizing electric field that may be required to remove a remanent polarization.

A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, e.g., via a static (C-V)

and/or time-resolved measurement or by polarization-voltage (P-V) or positive-up-negative-down (PUND) measurements.

According to various aspects, in various types of applications, e.g., in memory technology, a remanent polarization as low as 0 $\mu C/cm^2$ to 3 $\mu C/cm^2$ may be regarded as no substantial remanent polarization. Such low values of a remanent polarization may be present in a layer or material due to undesired effects, e.g., due to a not ideal layer formation. According to various aspects, in various types of applications, e.g., in memory technology, a remanent polarization greater than 3 $\mu C/cm^2$ may be regarded as substantial remanent polarization. Such a substantial remanent polarization may allow for storing information as a function of a polarization state of a spontaneously polarizable layer or a spontaneously polarizable material.

In a usual capacitor structure, the amount of charge stored therein may be used to define a memory state (e.g., first amount of charge stored in the capacitor structure may define a first memory state and a second amount of charge stored in the capacitor structure may define a second memory state.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the residual polarization in the material in the case that an applied electric field is removed. In general, ferroelectricity and anti-ferroelectricity may be concepts to describe a spontaneous polarization of a material similar to ferromagnetism and anti-ferromagnetism used to describe remanent magnetization in magnetic materials. According to various aspects, an electric coercive field, $E_C$, (also referred to as coercive field) may be or may represent the electric field required to depolarize a remanent-polarizable layer.

According to various aspects, the spontaneously-polarizable memory element 124 may include or may consist of a remanent-polarizable material. A remanent-polarizable material may be a material that is remanently polarizable and shows a remanence of the spontaneous polarization, such as a ferroelectric material. In other aspects, remanent-polarizable material may be a material that is spontaneously polarizable and that shows no remanence, e.g., an anti-ferroelectric material under the additional conditions that measures are implemented to generate an internal electric-field within the anti-ferroelectric material. Hence, a non-remanently polarizable material, such as an anti-ferroelectric ("antiferroelectric") material may exhibit remanent polarizable properties within certain structures. An internal electric-field within an anti-ferroelectric material may be caused (e.g., applied, generated, maintained, as examples) by various strategies: e.g., by implementing floating nodes that may be charged to voltages different from zero volts, and/or by implementing charge storage layers, and/or by using doped layers, and/or by using electrode layers that adapt electronic work-functions to generate an internal electric field, by using an encapsulation structure which introduces compressive stress or tensile stress onto the memory element 124, thereby establishing the spontaneously polarizable properties, only as examples. The spontaneously-polarizable memory element 124 including or being made of a remanent-polarizable material may be referred to herein as remanent-polarizable memory element (e.g., as remanent-polarizable layer).

In some aspects, the spontaneously-polarizable material (e.g., a remanent-polarizable material) may be based on at least one metal oxide. Illustratively, a composition of the spontaneous-polarizable material may include the at least one metal oxide for more than 50%, or more than 66%, or more than 75%, or more than 90%. In some aspects, the spontaneous-polarizable material may include one or more metal oxides. The spontaneous-polarizable material may include (or may be based on) at least one of $Hf_aO_b$, $Zr_aO_b$, $Si_aO_b$, $Y_aO_b$, as examples, wherein the subscripts "a" and "b" may indicate the number of the respective atom in the spontaneous-polarizable material.

In some aspects, the spontaneous-polarizable material (e.g., the remanent-polarizable material) may be or may include a ferroelectric material, illustratively the memory element 124 may be ferroelectric memory element (for example a ferroelectric layer). A ferroelectric material may be an example of a material used in a spontaneously-polarizable memory element (e.g., in a remanent-polarizable element). The ferroelectric material may be or may include at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide (also referred to as hafnium zirconium oxide). Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as one example.

In some aspects, the spontaneous-polarizable material may include hafnium oxide (e.g., may consist of hafnium oxide, hafnium zirconium oxide (e.g., $Hf_{0.75}$ $Zr_{0.25}O_2$ or $Hf_{0.5}$ $Zr_{0.5}O_2$), hafnium silicon oxide, hafnium lanthanum oxide, or hafnium lanthanum zirconium oxide), zirconium oxide, and/or aluminum nitride (e.g., may consist of aluminum nitride, aluminum scandium nitride or aluminum boron nitride). In some aspects, the spontaneous-polarizable material may include or may consist of $Hf_{1-x}Zr_xO_2$, $Hf_{1-x}Si_xO_2$, $Hf_{1-x}La_xO_2$, $Hf_{1-x-y}La_xZr_xO_2$, $Al_{1-x}Sc_xN$, or $Al_{1-x}B_xN$.

The spontaneously polarizable material of the memory element 124 may include or may consist of lead zirconate titanate ($Pb[Zr_xTi_{1-x}]O_3$, PZT) or strontium bismuth tantalate ($Sr_2Bi_2TaO_9$, SBT). However, there are several disadvantages for integrating PCT and SBT in complementary metal-oxide-semiconductor (CMOS):

Polycrystalline PZT or SBT films may require a thickness of more than 70 nm in order to ensure that the complete film is ferroelectric. However, the lateral dimension in CMOS integration may not be scalable such that the thick films lead to huge height difference between the SPOC structure 120 and the logic area forming below the interlayer metallization.

PZT and SBT require four elements and cannot be deposited using atomic layer deposition (ALD). Hence, PZT and SBT cannot be used for a 3D-integration of the SPOC structure 120, but merely for planar structures.

PZT and SBT include elements which may contaminate CMOS facilities. PZT even includes lead (Pb) which is considered toxic. This may require a special encapsulation of the whole SPOC structure 120. Further, dedicated tools may be required for depositing the toxic elements.

PZT and SBT have a comparatively small band gap (e.g., 3.0 to 3.5 eV for PZT). Hence, PZT and SBT cannot be used for devices that require low leakage currents through the SPOC structure 120.

As described, the spontaneously polarizable material of the memory element 124 may consist of hafnium zirconium oxide ($Hf_{1-x}Zr_xO_2$, HZO) with $0 \leq x \leq 1$ (i.e., consisting of hafnium oxide in the case of x=0 and consisting of zirconium oxide in the case of x=1). There are several advantages of HZO for CMOS integration:

HZO films are ferroelectric or antiferroelectric down to a thickness of 1 nm. Hence, the integration of the SPOC structure 120 in lateral dimension is scalable to a maximum degree.

HZO films can be deposited using ALD. This allows to manufacture SPOC structure 120 having curved structures and allow a 3D-integration of the SPOC structure 120.

HZO films are CMOS compatible and do not include any toxic elements. Hence, an encapsulation of the SPOC structure 120 may be optional and the standard CMOS equipment can be used.

It may be possible to crystallize the HZO into the ferroelectric phase by annealing at temperatures in a range from about 300° C. to about 400° C. This allows an integration of the SPOC structure 120 as part of the interlayer metallization.

HZO films have a large band gap (e.g., 5.8 eV for hafnium oxide). Thus, HZO can be used for devices that require a low leakage current.

According to various aspects, the SPOC may be or may include a ferroelectric capacitor (FeCAP) or an anti-ferroelectric capacitor (AFeCAP). An information may be stored by the memory capacitor via at least two remanent polarization states of the SPOC structure 120. The programming of the SPOC structure 120 (illustratively the storage of information therein) may be carried out by providing (e.g., applying) an electric field to thereby set or change the remanent polarization state of the spontaneously polarizable memory element 124. Illustratively, the spontaneous-polarizable material (e.g., a ferroelectric material, e.g., an antiferroelectric material) may be used to store data in nonvolatile manner in integrated circuits.

It may be understood that, even though various aspects refer to a memory element including or being made of a spontaneously-polarizable material, other memory elements whose state may be altered by an electric field provided across a capacitive memory structure may be used as long as the structure of the material can be changed via application of an electric field, as described herein.

The SPOC structure 120 may have any suitable configuration. For example, the SPOC structure 120 may be disposed within a trench and the layers of the SPOC structure 120 may be disposed conformally over a substrate portion within the trench. As another example, the memory cell may be configured as a fin field-effect transistor (FinFET). The substrate portion in which the channel region is provided may have the shape of a vertical fin, wherein the gate isolation and the gate electrode may at least partially surround the fin. In an even further example, the memory cell may be configured as a nanosheet or nanowire field-effect transistor. The substrate portion(s), in which a respective channel region is provided, may each have the shape of a nanosheet or nanowire. The gate isolation and the gate electrode may at least partially surround the respective nanosheets or nanowires.

The SPOC structure 120 may have a capacitive configuration with a (first) SPOC capacitance, $C_{SPOC}$, associated therewith.

The memory structure 100 may include an access device. Herein, for illustration, the access device is described exemplarily as a field effect transistor (FET), such as a field-effect transistor (FET) structure 100 providing the (e.g., n-type or p-type) FET. It is understood that this serves for illustration and that the access device may be any other kind of access device.

The field-effect transistor, FET, structure 110 may include a gate structure, wherein the gate structure may include a gate isolation and a gate electrode. The gate structure may be a planar gate stack or may have another field-effect transistor designs with a non-planar shape, for example a trench gate transistor design, a vertical field-effect transistor design, or other designs, such as a fin-FET design.

The FET structure 110 may have a first source/drain terminal 112 (e.g., a source terminal), a second source/drain terminal 114 (e.g., a drain terminal), and a gate terminal 116. The field-effect transistor structure 110 may include a first source/drain region (e.g., a source region) connected to the first terminal 112 and a second source/drain region (e.g., a drain region) connected to the second terminal 114. The gate structure of the FET structure 110 may be connected to the gate terminal 116.

The gate structure may define a channel region, e.g., provided in a semiconductor portion (e.g., in a semiconductor layer, in a semiconductor die, etc.). The gate structure may allow for a control of an electrical behavior (e.g., a resistance R) of the channel region, e.g., a current flow in the channel region may be controlled (e.g., allowed, increased, prevented, decreased, etc.). In some aspects, the gate structure 118, for example, allow to control (e.g., allow or prevent) a source/drain current, $I_{SD}$, from the first source/drain region to the second source/drain region. The channel region and the source/drain regions may be formed, e.g., via doping one or more semiconductor materials or by the use of intrinsically doped semiconductor materials, within a layer and/or over a layer. With respect to the operation of the field-effect transistor structure 110, a voltage may be provided at the gate terminal 116 to control the current flow, $I_{SD}$, in the channel region, the current flow, $I_{SD}$, in the channel region being caused by voltages supplied via the source/drain regions.

According to various aspects, the semiconductor portion (illustratively, where the channel region may be formed), may be made of or may include silicon. However, other semiconductor materials of various types may be used in a similar way, e.g., germanium, Group III to V (e.g., SiC), or other types, including for example carbon nanotubes, organic materials (e.g., organic polymers), etc. In various aspects, the semiconductor portion may be a wafer made of silicon (e.g., p-type doped or n-type doped). In other aspects, the semiconductor portion may be a silicon on insulator (SOI) wafer. In other aspects, the semiconductor portion may be provided by a semiconductor structure, e.g., by one or more semiconductor fins, one or more semiconductor nanosheets, one or more semiconductor nanowires, etc., disposed at a carrier.

The gate electrode may include an electrically conductive material, for example, a metal, a metal alloy, a degenerate semiconductor (in other words a semiconductor material having such a high level of doping that the material acts like a metal and not anymore as a semiconductor), and/or the like. As an example, the gate electrode may include or may be made of aluminum. As another example, the gate electrode may include or may be made of polysilicon. According to various aspects, the gate electrode may include one or more electrically conductive portions, layers, etc. The gate electrode may include, for example, one or more metal layers (also referred to as a metal gate), one or more polysilicon layers (also referred to as poly-Si-gate), etc. A metal gate may include, for example, at least one work-function adaption metal layer disposed over the gate isolation and an additional metal layer disposed over the work-function adaption metal layer. A poly-Si-gate may be, for example, p-type doped or n-type doped.

The gate isolation may be configured to provide an electrical separation of the gate electrode from the channel region and further to influence the channel region via an electric field generated by the gate electrode. The gate isolation may include one or more electrically insulating layers, as an example. Some designs of the gate isolation may include at least two layers including different materials, e.g., a first gate isolation layer (e.g., a first dielectric layer including a first dielectric material) and a second gate isolation layer (e.g., a second dielectric layer including a second dielectric material distinct from first dielectric material).

According to various aspects, the memory structure 100 may provide or may be part of a memory cell. A residual polarization of the memory element 124 (e.g., the polarization of the spontaneously-polarizable material of the memory element 124) may define the memory state the memory cell is residing in.

In the case that the spontaneously polarizable material of the memory element 124 is a ferroelectric material, the memory cell may be a ferroelectric random-access memory (FeRAM) cell.

The memory cell may be written into a memory state by applying a voltage (e.g., a wordline voltage, $V_{WL}$) to the gate terminal 116 as well as a voltage (e.g., bitline voltage, $V_{BL}$) to the second source/drain terminal 114 and/or a voltage (e.g., plateline voltage, $V_{PL}$) to the first SPOC terminal 106.

In a memory cell arrangement, the gate terminal 116 may be connected to a wordline, the second source/drain terminal 114 may be connected to a bitline, and the first SPOC terminal 106 may be connected to a plateline. In this scenario (i.e., in the case that the memory cell or memory cell arrangement does not include the write modification circuit 202 described herein), the voltage bitline voltage, $V_{BL}$, applied to the bitline, BL, may, for example, be either zero or a (positive) supply voltage, $V_{dd}$, resulting in that substantially all of the voltage drops over the SPOC 104 (i.e., $V_{SPOC} \approx Vdd$). This may be considered to be equivalent to an infinite bitline capacitance, $C_{BL}$, (such that $$\frac{C_{BL}}{C_{SPOC}} = \text{infinite}).$$

Figure 5A:
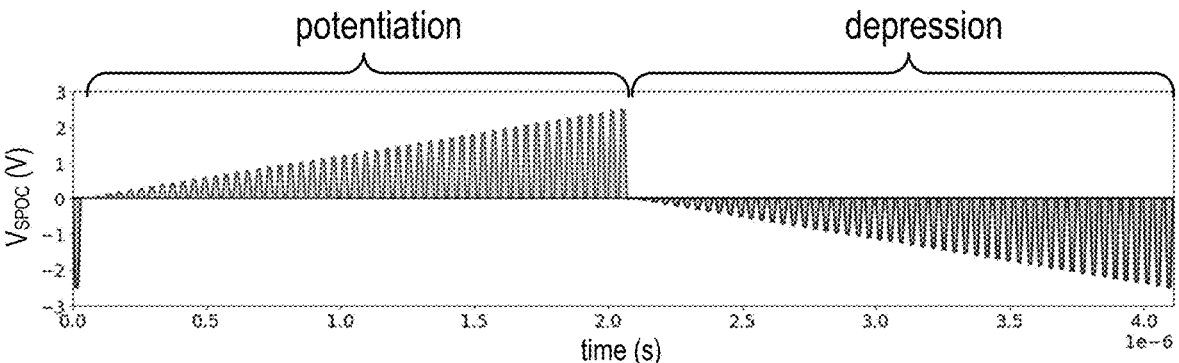
FIG. 5A and FIG. 5B each show an exemplary pulse sequence associated with a linear writing of memory states.
Figure 5B:
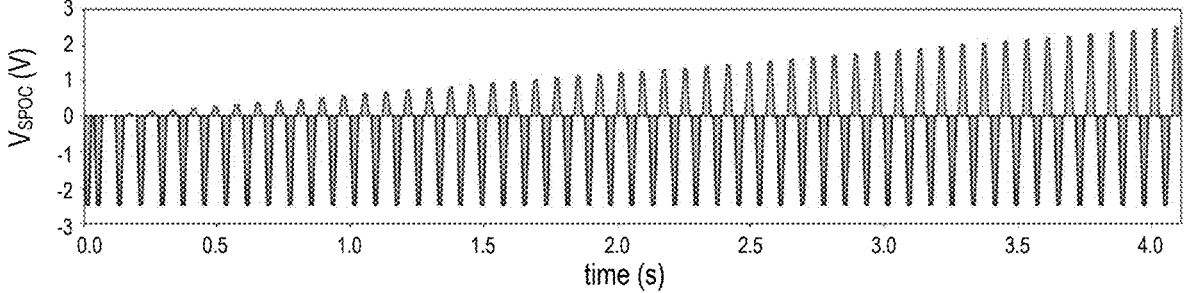
Figure 5C:
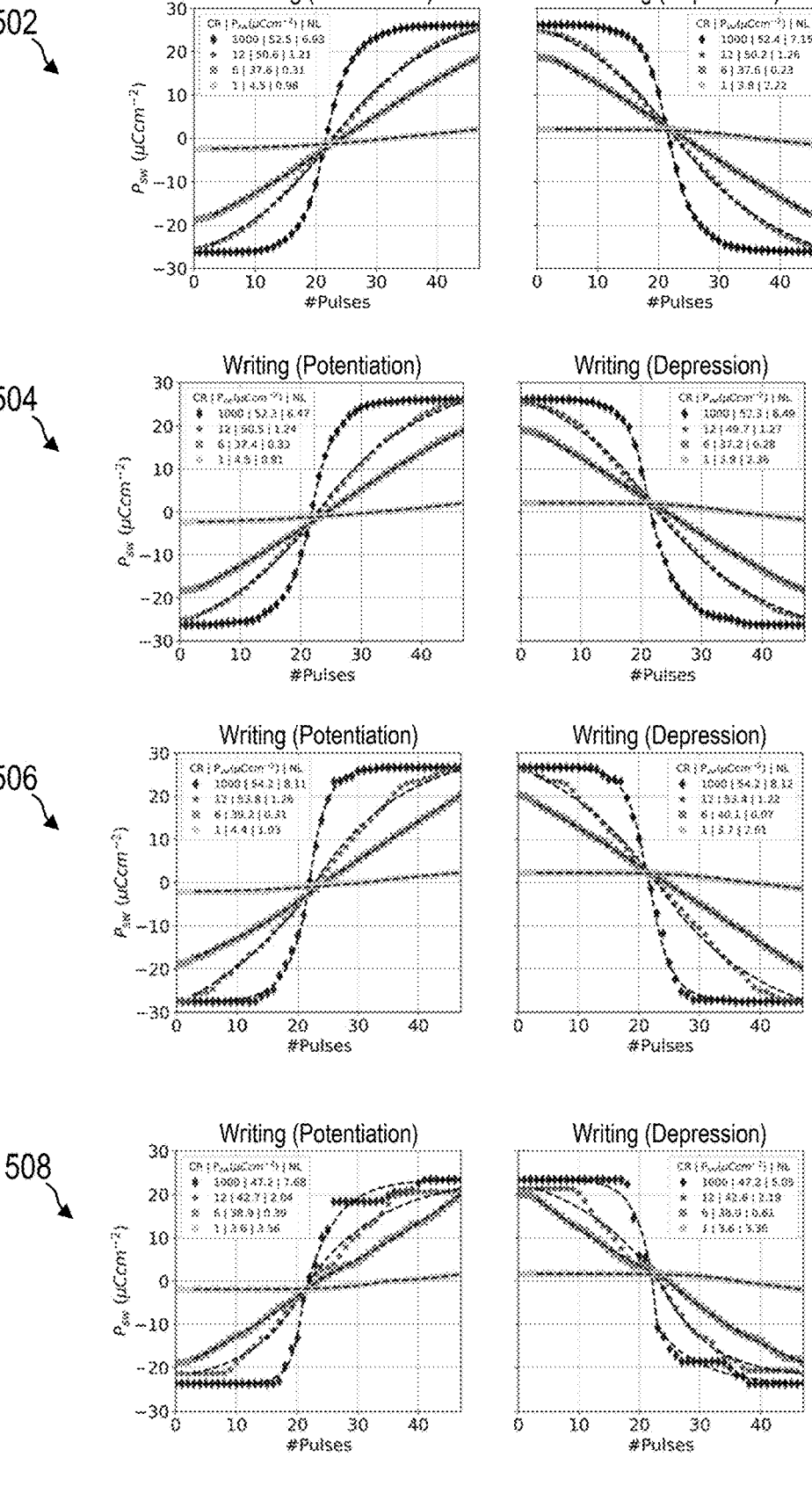
FIG. 5C shows exemplarily simulated writing curves for different capacitance ratios of the capacitance of the write capacitor to the capacitance of the spontaneously polarizable capacitor.

In this scenario, the polarization of the memory element 124 is an s-shape function of the voltage over the SPOC 104 (see for illustration the diamond-curves in FIG. 5C representing a capacitance ratio, CR, of 1000). Due to this, only two states (e.g., one for maximum positive polarization and one for maximum negative polarization) can be written. For example, a "1" may be written by applying a wordline voltage, $V_{WL}$, greater than a sum of the (positive) supply voltage, $V_{dd}$, and a threshold voltage, $v_T$, of the FET, zero-voltage as plateline voltage, $V_{PL}$, and the (positive) supply voltage, $V_{dd}$, as bitline voltage, $V_{BL}$. For example, a "0" may be written by applying a wordline voltage, $V_{WL}$, greater than the threshold voltage, $v_T$, of the FET, zero-voltage as bitline voltage, $V_{BL}$, and the (positive) supply voltage, $V_{dd}$, as plateline voltage, $V_{PL}$. To read the memory state of the memory cell, a wordline voltage, $V_{WL}$, greater than the sum of the (positive) supply voltage, $V_{dd}$, and the threshold voltage, $v_T$, of the FET and the (positive) supply voltage, $V_{dd}$, as plateline voltage, $V_{PL}$, may be applied, and a voltage at the bitline may be sensed. When reading, a part of the (positive) supply voltage, $V_{dd}$, may drop over the SPOC 104 (with $$V_{SPOC} \sim \frac{C_{BL}}{C_{SPOC} + C_{BL}} Vdd)$$

and a capacitance ratio of the bitline capacitance, $C_{BL}$, to the capacitance of the SPOC, $C_{SPOC}$, may be about ten $$\left(\frac{CBL}{Cfe} \sim 10\right).$$

Hence, in this scenario, the memory cell may be limited to two memory states.

FIG. 2A to FIG. 2D each show an equivalent circuit and various aspects of a memory cell arrangement 200 which includes a write modification circuit 202 according to various aspects.

The write modification circuit 202 may include a first (e.g., output) write modification circuit terminal 204 and a second (e.g., input) write modification circuit terminal 206. The write modification circuit 202 may include one or more write capacitors 208($n$=1 to N). "N" may be any integer number equal to or greater than one (i.e., N≥1).

Each write capacitor 208($n$) of the one or more write capacitors 208($n$=1 to N) may have a respective (dielectric) capacitance, $C_{D, n}$.

Each write capacitor of the one or more write capacitors 208($n$=1 to N) may be a dielectric capacitor.

In the case that the write modification circuit 202 includes a plurality of write capacitors 208($n$=1 to N) (with N≥2), the write capacitors 208($n$) of the plurality of write capacitors 208($n$=1 to N) may be connected in parallel to one another.

For illustration, each write capacitor 208($n$) is described herein and illustrated in the figures as a single capacitor. It is understood that a write capacitor 208($n$) described herein may include one or more capacitors connected in series to one another. In the case that a write capacitor 208($n$) includes, for example, two capacitors having a first capacitance, $C_1$, and a second capacitance, $C_2$, respectively, the capacitance, $C_{D, n}$, of the write capacitor 208($n$) may then be the equivalent capacitance, $C_{eq}$, (may also be referred to as total capacitance, $C_T$) of the first capacitance, $C_1$, and the second capacitance, $C_2$:

$$C_{D,n} = \cfrac{1}{\cfrac{1}{C_1} + \cfrac{1}{C_2}}$$

According to various, the write modification circuit 202 may be configured to selectively provide a (second) write capacitance, $C_W$ (in some aspects also referred to as write modification capacitance). The write modification circuit 202 may be configured to provide the write capacitance, $C_W$, when the memory cell is written but not when the memory cell is read.

The write modification circuit 202 (and thus each of the one or more write capacitors 208($n$=1 to N)) may be connected in series with the SPOC 104. Thus, in the case that the write modification circuit 202 provides the write capacitance, $C_W$, (during writing the memory cell), the SPOC capacitance, $C_{SPOC}$, and the write capacitance, $C_W$, may form a capacitive voltage divider.

In the case that the write modification circuit 202 includes the plurality of write capacitors 208($n$=1 to N) (with N≥2), the write modification circuit 202 may be configured to selectively charge one or more of the plurality of write capacitors 208($n$=1 to N). The write capacitance, $C_W$, may then be an equivalent capacitance of the respective capacitances, $C_{D,\ n}$, of the one or more charged write capacitors. Thus, in the case that two or more write capacitors are charged, the write capacitance, $C_W$, may be a sum of the respective capacitances of these two or more write capacitors.

In the following, for illustration, charging the one or more write capacitors 208($n$=1 to N) and the one or more write capacitors 208($n$=1 to N) being in a charged state may be referred to as the one or more write capacitors 208($n$=1 to N) being activated. Accordingly, not charging the one or more write capacitors 208($n$=1 to N) may be referred to the one or more write capacitors 208($n$=1 to N) being deactivated. It is understood that the phrases "activated" and "deactivated" serve for illustration purposes and that the phrase "activated write capacitors" and "activating write capacitors" refers to "charged write capacitors" and "charging the write capacitors", respectively. Accordingly, the phrase "deactivated write capacitors" and "deactivating write capacitors" refers to "not charged write capacitors" and "not charging the write capacitors", respectively.

As detailed herein, the write modification circuit 202 may be connected in series with the SPOC 104. The write modification circuit 202 may interconnected in any suitable manner as long as the write modification circuit 202 is connected in series with the SPOC 104. In some aspects, the write modification circuit 202 may be part of the memory cell itself. In other aspects, the write modification circuit 202 may not be part of the memory cell; in this case the write modification circuit 202 may be connected to more than one memory cell. As a first example, the write modification circuit 202 (e.g., the first write modification circuit terminal 204) may be connected to the second source/drain terminal 114 (see, for example, FIG. 2B). As a second example, the write modification circuit 202 may be connected between the first source/drain terminal 112 and the SPOC 104 (see, for example, FIG. 2C). Thus, the first write modification circuit terminal 204 may be connected to the second SPOC terminal 108 and the second write modification circuit terminal 206 may be connected to the first source/drain terminal 112, or vice versa. As a third example, the write modification circuit 202 (e.g., the first write modification circuit terminal 204) may be connected to the first SPOC terminal 106 (see, for example, FIG. 2D).

A memory cell including at least one capacitor (i.e., at least the SPOC 104) may also be referred to as a capacitor type memory cell. In the case that the write modification circuit 202 is not part of the memory cell, the memory cell may be a one transistor, T, one capacitor, C, memory cell (1T1C cell). In the case that the write modification circuit 202 is not part of the memory cell, the memory cell may be a one transistor multiple capacitors memory cell (1TxC cell).

The memory cell may be part of a memory cell arrangement. The memory cell arrangement may include a controller (e.g., a memory controller).

It is noted that a memory cell arrangement is usually configured in a matrix-type arrangement, wherein columns and rows define the addressing of the memory cells according to the control lines connecting respectively subsets of memory cells of the memory cell arrangement along the rows and columns of the matrix-type arrangement. However, other arrangements may be suitable as well.

In general, a memory cell arrangement may include a plurality of (e.g., volatile or non-volatile) memory cells, which may be accessed individually or on groups via a corresponding addressing scheme. The matrix architecture may be, for example, referred to as "OR", "AND", "NOR", or "NAND" architecture, depending on the way neighboring memory cells are connected to each other, i.e., depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a first control line and a second control line. For example, groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells.

The memory cell described herein (e.g., as part of a memory cell arrangement) may be used in connection with any type of suitable controller, e.g., a controller that may generate only two or only three different voltage levels for writing the memory cell (e.g., for writing one or more memory cells of a memory cell arrangement). However, in other aspects, more than four different voltage levels may be used for operating (e.g., for reading) the memory cell or for operating one or more memory cells of a memory cell arrangement.

According to various aspects, the memory cell described herein may be configured complementary metal oxide semiconductor (CMOS) compatible, e.g., including standard CMOS-materials only and may require no special integration considerations (e.g., no special thermal budget which may avoid diffusion and/or contamination during manufacturing). CMOS compatible spontaneously polarizable materials may be used to implement the one or more memory cell based on, for example, $HfO_2$ and/or $ZrO_2$. Doped $HfO_2$ (e.g., Si:$HfO_2$ or Al:$HfO_2$) or other suitable spontaneously-polarizable materials may allow for an integration of the spontaneously polarizable layer via known integration schemes.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state".

According to various aspects, a memory device may include a memory cell and a controller (e.g., a memory controller) configured to operate (e.g., read and write) the memory cell.

It is noted that some aspects are described herein with reference to a memory cell of a memory device and/or with reference to a memory cell of memory cell arrangement; it is understood that a memory device and/or a memory cell arrangement may include a plurality of such described memory cells according to various aspects that can be operated in the same way by the controller, e.g., at the same time or in a time sequence. A memory cell arrangement may further include respective sets of control lines and voltage supply levels configured to operate the one or more memory cells of the memory device and/or the memory cell arrangement.

Figure 3A:
FIG. 3A and FIG. 3B each show an exemplary memory cell arrangement including a plurality of memory cells and various control lines for addressing the plurality of memory cells.

FIG. 3A shows an exemplary memory cell arrangement 300A including a plurality of memory cells, wherein each memory cell includes the memory structure 200. Thus, each memory cell may include the write modification circuit 202.

Figure 3B:
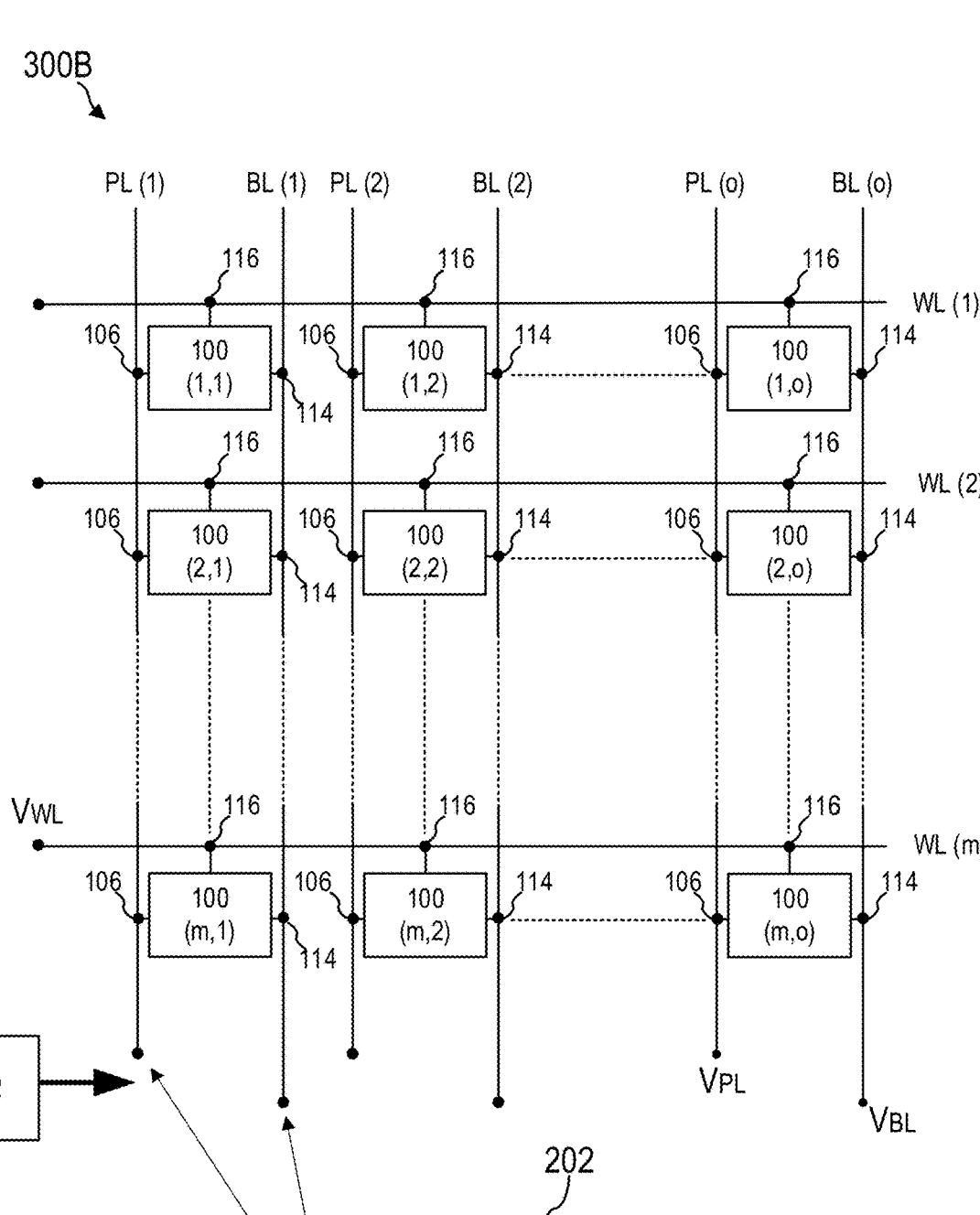

FIG. 3B shows an exemplary memory cell arrangement 300B including a plurality of memory cells, wherein each memory cell includes the memory structure 100. The memory cell arrangement 300B further includes one or more write modification circuits 202, wherein each memory cell is associated with one of the one or more write modification circuits 202.

A memory cell arrangement described herein may include an array of O times M memory cells. "O" may be any integer number equal to or greater than one. "M" may be any integer number equal to or greater than one.

The memory cell arrangement 300A, 300B may include a controller 302 (in some aspects referred to as control circuit). The controller 302 may be configured to apply a respective voltage to each control line described herein. The controller 302 may be configured to control each write modification circuit 202 of the memory cell arrangement 300A, 300B. The controller 302 may be configured to control a write modification circuit 202 to provide the write capacitance, $C_W$, when writing a memory cell associated with this write modification circuit 202. The controller 302 may be configured to control a write modification circuit 202 to not provide the write capacitance, $C_W$, when reading a memory cell associated with this write modification circuit 202.

The memory cell arrangement 300A, 300B may include various sets of control lines. The memory cell arrangement 300A, 300B may include a plurality of bitlines BL(o=1 to O), a plurality of wordlines WL(m=1 to M), and a plurality of platelines PL(o=1 to O) for individually addressing one or more of the memory cells.

In an example, each bitline, BL(o), may be connected to a respective write modification circuit 202(o). Thus, in this example, the respective write modification circuit 202(o) may be connected to the respective second source/drain terminal 114 of each memory cell which is connected to the bitline, BL(o).

In another example, the memory cell arrangement 300A, 300B may include at least one common bitline connected to a write modification circuit 202. The at least one common bitline may be connected to two or more bitlines, BL(o). Thus, in this example, the common bitline, and thus the write modification circuit 202, may be common to a certain amount of memory cells. The common bitline may be common to the two or more bitlines, BL(o), by way of signal lines (e.g., interconnects) and/or by way of decoder circuitry.

In a further example, each plateline, PL(o), may be connected to a respective write modification circuit 202(o). Thus, in this example, the respective write modification circuit 202(o) may be connected to the respective first SPOC terminal 108 of each memory cell which is connected to the plateline, PL(o).

In an even further example, the memory cell arrangement 300A, 300B may include at least one common plateline connected to a write modification circuit 202. The at least one common plateline may be connected to two or more platelines, PL(o). Thus, in this example, the common plateline, and thus the write modification circuit 202, may be common to a certain amount of memory cells. The common plateline may be common to the two or more plateline, PL(o), by way of signal lines (e.g., interconnects) and/or by way of decoder circuitry. For example, a plateline may be common to all memory cells in a sector. As another example, a plateline may be common to a predefined number (e.g., eight) of wordlines.

Figure 4A:
FIG. 4A and FIG. 4B each show an exemplary configuration of the write modification circuit according to various aspects.
Figure 4A:
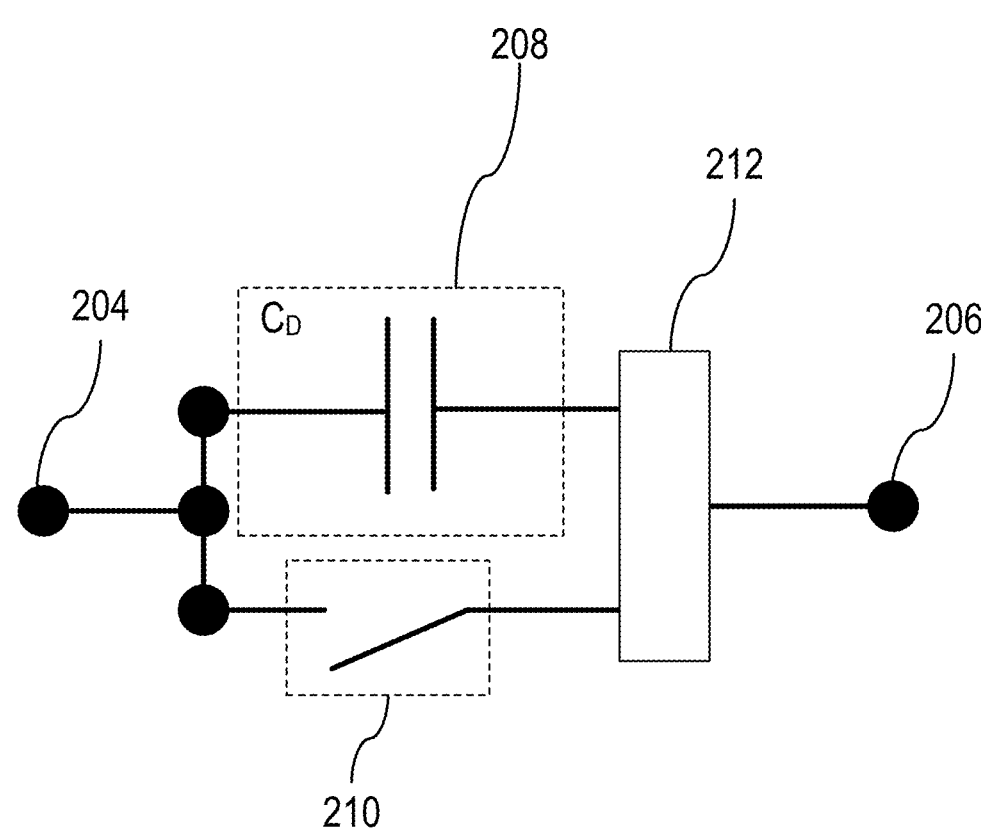
Figure 4B:
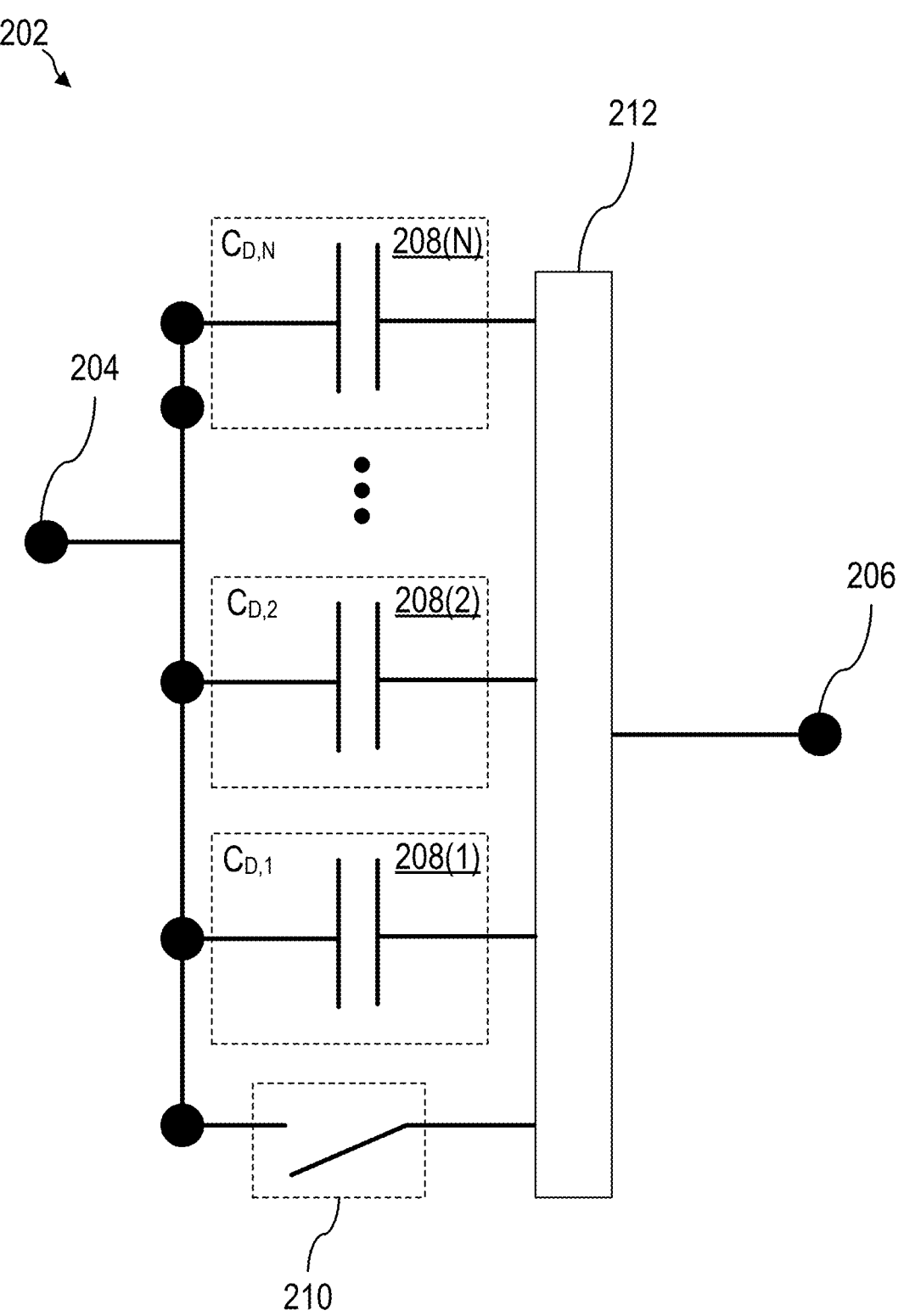

FIG. 4A and FIG. 4B each show an exemplary configuration of the write modification circuit 202 according to various aspects.

As detailed herein, the write modification circuit 202 may include one or more write capacitors 208($n$=1 to N). FIG. 4A shows an exemplary configuration of the write modification circuit 202 for N=1. FIG. 4B shows an exemplary configuration of the write modification circuit 202 including a plurality of write capacitors 208($n$=1 to N), i.e., N>1. The write capacitors of the plurality of write capacitors 208($n$=1 to N) may be connected in parallel to one another.

According to various, the write modification circuit 202 may include a (e.g., electronic) switch 210. The switch 210 may be connected in parallel to the one or more write capacitors 208($n$=1 to N).

According to various, the write modification circuit 202 may include a selector circuit 212. With reference to the configuration of FIG. 4A, the selector circuit 212 may be configured to select either the write capacitor 208 or the switch 210. With reference to the configuration of FIG. 4B, the selector circuit 212 may be configured to select either one or more write capacitors of the plurality of write capacitors 208($n$=1 to N) or the switch 210. This allows that the write capacitance, $C_W$, (being an equivalent capacitance of the capacitances of the one or more write capacitors which are selected) can be set to different values depending on the selected write capacitors. Thus, there may be a plurality of possible write capacitances. In the case that each write capacitor of the plurality of write capacitors 208($n$=1 to N) has a respective capacitance which is different from the capacitances of the other write capacitors, a number (I) of possible write capacitance, $C_W$, with $$I = \binom{1}{N} + \binom{2}{N} + \dots + \binom{N}{N}.$$

For example, in the case of N=3, there are the seven following possible selections: n=1; n=2; n=3; n=1 and n=2; n=1 and n=3; n=2 and n=3; and n=1, n=2, and n=3. However, even in the case that all write capacitors of the plurality of write capacitors 208(n=1 to N) would have the same capacitance, there are still different possible write capacitances. For example, in the case of N=3, there would be: a first write capacitance ($C_W=C$) associated with selecting only one of the write capacitors, a second write capacitance ($C_W=2C$) associated with selecting (exactly) two of the write capacitors, and a third write capacitance ($C_W=3C$) associated with selecting all three write capacitors.

As detailed herein, the write capacitance, $C_W$, of the write modification circuit 202 may be provided during writing a memory state of the memory cell but not when reading a memory state of the memory cell. In this context, it is understood that the bitline capacitance, $C_{BL}$, is present in both, writing and reading. Similarly, even when considering a FET capacitance, $C_{FET}$, associated with the field-effect transistor structure 110, this FET capacitance, $C_{FET}$, is also present in both, writing and reading. Illustratively, the channel region, the gate isolation, and the gate electrode may have a capacitance, $C_{FET}$, associated therewith, originating from the more or less conductive regions (the channel region and the gate electrode) separated from one another by the gate isolation. Further illustratively, the channel region may be considered as a first capacitor electrode, the gate electrode as a second capacitor electrode, and the gate isolation as a dielectric medium between the two capacitor electrodes. Thus, it is understood that the write capacitance, $C_W$, detailed herein can neither be mapped to the bitline capacitance, $C_{BL}$, nor the ET capacitance, $C_{FET}$. Thus, it is understood that the one or more write capacitors of the write modification circuit 202 are additional electronic components different from a control line and a FET.

As detailed herein, the write capacitance, $C_W$, may be provided during writing the memory cell into a memory state (e.g., by selecting (e.g., activating) at least one write capacitor 208(n)) and may be not provided during reading the memory cell (e.g., by selecting (e.g., activating) the switch 210). An activation of the switch 210 may associated with closing the switch 210 and deactivating the switch 210 may be associated with opening the switch 210. It is understood that either the switch 210 or at least one write capacitor 208(n) are selected. Thus, in the case that the switch is activated (e.g., closed), none of the one or more write capacitors 208(n=1 to N) is activated, and in the case that at least one of the capacitors 208(n=1 to N) is activated, the switch is deactivated (e.g., open).

Hence, the selector circuit 212 may be configured to, when selecting (e.g., activating) the switch 210, to close the switch 210 and to prohibit (e.g., block) a charging of any one of the one or more write capacitors 208(n=1 to N). The selector circuit 212 may be configured to, when selecting (e.g., activating) one or more write capacitors 208, to deactivate (e.g., open) the switch 210. The selector circuit 212 may be configured to (in the case of N>1), when selecting one or more write capacitors 208(n) of the plurality of write capacitors 208(n=1 to N), to allow the one or more write capacitors 208(n) to charge and prohibit that the other write capacitors of the plurality of write capacitors 208(n=1 to N) are charged.

Due to closing the switch 210 during reading the memory state of the memory cells, substantially all of the read voltage drops over the SPOC 104 which enables an efficient read.

"Writing" a memory cell, as used herein, may be understood as changing a memory state of the memory cell from a first memory state to a second memory state different from the first memory state. The memory state of the memory cell may be associated with a polarization state of the SPOC 104 (e.g., its memory element 124). The polarization state of the SPOC 104 may determine the amount of charge stored in the SPOC 104. The amount of charge stored in the SPOC 104 may be used to define the memory state of the memory cell. Thus, writing the memory cell may be associated with applying an electric field to the SPOC 104 to thereby set (e.g., change) the (e.g., remanent) polarization state of the SPOC 104.

According to various, providing the write capacitance, $C_W$, during writing of the memory cell allows to linearly write the SPOC 104.

As used herein, "writing" the memory cell may refer to increasing an absolute value of the polarization as well as decreasing an absolute value of the polarization of the SPOC 104. Applying voltages (e.g., a sequence of voltage pulses) of increasing positive absolute voltage values over the SPOC 104 may be referred to as potentiation. Applying voltages (e.g., a sequence of voltage pulses) of increasing negative absolute voltage values over the SPOC 104 may be referred to as depression. FIG. 5A and FIG. 5B each show an exemplary pulse sequence associated with a linear writing of memory states. The pulse sequence shown in FIG. 5A represents a cumulative switching, wherein an initial (erasing) pulse is applied to write the memory cell into a maximum negative state and then the memory cell is written by successive voltage pulses of increasing positive absolute voltage values (for potentiation) and subsequently increasing negative absolute voltage values (for depression). The pulse sequence shown in FIG. 5B represents the potentiation part of a targeted switching, wherein a respective (erasing) voltage pulse of opposite sign (i.e., a negative voltage pulse for potentiation and a positive voltage pulse for depression) is applied between two consecutive voltage pulses. Illustratively, in the case of cumulative switching the charge stored in the SPOC structure 104 is cumulated by successive voltage pulses and in the case of the targeted switching the SPOC structure 104 is charged to a corresponding capacity which is defined by the respectively applied voltage pulse. It is understood that these represent exemplified pulse sequences (in this example the pulses have a pulse duration of about 10 ns). In some aspects, writing the memory cell may include applying multiple pulses of a substantially same height.

In some aspects, writing the memory cell may be referred to as programming the memory cell.

FIG. 5C shows simulation results of exemplarily simulated writing curves (for both, potentiation and depression) for different capacitance ratios, CR, of the write capacitance, $C_W$, to the SPOC capacitance, $C_{SPOC}$ (i.e., $$CR = \frac{C_W}{C_{SPOC}}).$$

These simulations are carried out for ferroelectric hafnium oxide (HfO) as exemplary spontaneously polarizable material of the memory element 124. It is understood that this serves for illustration and that the memory element 124 may include any other spontaneously polarizable material (e.g., HZO). The simulation is calibrated using experimental data obtained (e.g., measured) for ferroelectric hafnium oxide. The simulation refers to the exemplary pulse sequence of FIG. 5A.

Each of the graphs 502, 504, 506, and 508 shows the (switching) polarization, $P_{SW}$, of the SPOC 104 as a function of the applied pulses (and thus the applied voltage values) for different capacitance ratios, CR. Thus, using the write capacitance, CW, detailed herein during writing may allow to achieve a substantially linear correlation between the polarization of the SPOC 104 and the voltage value (e.g., the voltage pulse amplitude and/or the voltage pulse width) of the write voltage pulse.

As illustratively shown, there is a range of CR values in which the polarization, $P_{SW}$, is a substantially linear function of the voltage applied over the SPOC 104. Hence, the range may have an upper limit at which the substantially linear shape changes to an s-shape. Thus, the non-linearity of the polarization curve may increase. A memory cell arrangement may include a plurality of memory cells having variations in their properties due to processing variations. Thus, there may be slight differences between different memory cells of the memory cell arrangement. In order to allow for writing and reading a specific polarization state (and hence memory state) to a memory cell in a memory cell arrangement, there may be a minimum polarization difference (APSW) between two consecutive memory states. Thus, there may be a minimum slope of the substantially linear polarization curve which allows for writing and reading memory states of memory cells in a memory cell arrangement. This minimum slope may define a lower limit of the range of CR values. For example, the slope of the polarization curve for CR=1 may be too low to define even two different memory states since a total polarization, $P_{SW}$, range (between a minimum of $P_{SW}$ and a maximum of $P_{SW}$) is about 4.5 µC/cm².

Due to the variation of the properties of the plurality of memory cells of the memory cell arrangement, it may be advantageous to have SPOC structures 120 with sharp (e.g., ferroelectric) switching peaks, thereby providing a higher reliability and/or a wider range of memory states.

Graph 502 shows the polarization, $P_{SW}$, curve for lateral dimensions of the memory element 124 (parallel to the first and second electrodes 126, 128) of about 1 µm times 1 µm, resulting in about 1450 ferroelectric crystallites. Graph 504 shows the polarization, $P_{SW}$, curve for lateral dimensions of the memory element 124 (parallel to the first and second electrodes 126, 128) of about 500 nm times 500 nm, resulting in about 360 ferroelectric crystallites. Graph 506 shows the polarization, $P_{SW}$, curve for lateral dimensions of the memory element 124 (parallel to the first and second electrodes 126, 128) of about 200 nm times 200 nm, resulting in about 60 ferroelectric crystallites. Graph 508 shows the polarization, $P_{SW}$, curve for lateral dimensions of the memory element 124 (parallel to the first and second electrodes 126, 128) of about 100 nm times 100 nm, resulting in about 15 ferroelectric crystallites. As illustratively shown, the approach of applying the write capacitance, $C_W$, during writing a memory cell as detailed herein allows to achieve a substantially linear writing curve in dimensions below 1 µm².

The dimensions of a capacitor may refer to the effective capacitance area of the capacitor. Thus, effective capacitance area of the write capacitor may be equal to or less than about one µm². The projection of the electrodes may define the effective capacitance area.

Various aspects detailed herein refer to a "substantially linear" polarization curve. A polarization curve of a spontaneously polarizable (e.g., ferroelectric) material may have a coercive voltage, $V_c$. The coercive voltage, $V_c$, (e.g., of a fully polarized capacitor) may be an external voltage which creates a (net) polarization, P, of zero. The polarization curve may be "substantially linear" in a voltage range. The voltage range may range from a first boundary voltage value, $V_{B1}$, to a second boundary voltage value, $V_{B2}$, and a size of the voltage range (also referred to as range size, $V_{B2}-V_{B1}$) may be a difference between the second boundary voltage value and the first boundary voltage value. According to various, a "substantially linear" polarization curve may refer to a polarization curve having a polarization, P, which changes substantially linear over voltage, V, (e.g., within the voltage range of range size). Thus, within the voltage range a change of the polarization (in some aspects also referred to as polarization change ΔP) may be substantially constant over a change of the voltage (in some aspects also referred to as voltage change ΔV). Illustratively, the "substantially linear" polarization curve may have a substantially linear slope (e.g., within the voltage range. According to various, the range size, $V_{B2}-V_{B1}$, of the voltage range may be equal to or greater than half the coercive voltage, $V_c$ (i.e., $$V_{B2} - V_{B1} \geq \frac{V_C}{2}).$$

In some aspect, the range size, $V_{B2}-V_{B1}$, of the voltage range may be equal to or greater than about two times the coercive voltage (i.e., $V_{B2}-V_{B1} \geq 2V_c$).

According to various, the writing curve may have a range size, $V_{B2}-V_{B1}$, of at least two volts.

As shown in the graphs of FIG. 5C, the potentiation writing curve and the depression writing curve may be (mirror) symmetric.

Figure 5D:
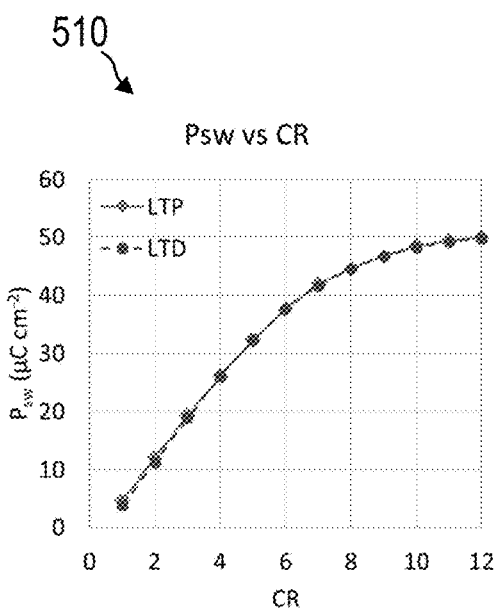
FIG. 5D and FIG. 5D show curves illustrating an exemplary determination of a capacitance of the write capacitor according to various aspects.
Figure 5D:
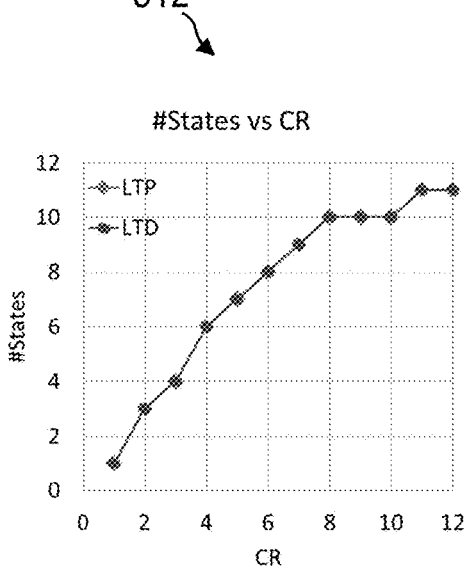
Figure 5D:
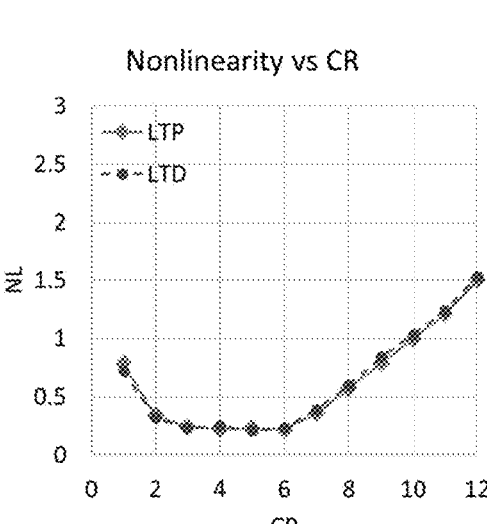
Figure 5D:
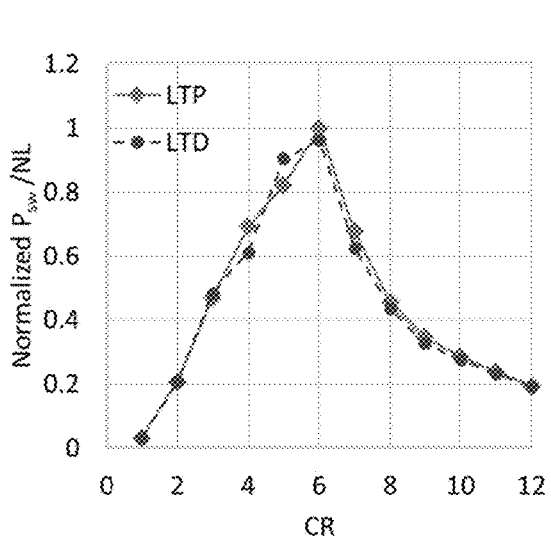

FIG. 5D and FIG. 5D show curves illustrating an exemplary determination of the CR range according to various aspects. It is understood that this is an exemplary determination for the exemplary scenario of ferroelectric hafnium oxide. Thus, the CR range (and an optimum CR) may vary for different spontaneously polarizable materials, different dimensions of the SPOC 104, etc.

The graphs 510, 512, 514, and 516 each show a respective property as a function of the capacitance ratio, CR, for potentiation (Long-Term Potentiation, LTP) and depression (Long-Term Depression, LTD).

Graph 510 shows the total polarization, $P_{SW}$, range as a function of the capacitance ratio, CR. It is understood that, for a given minimum polarization difference (APSW) between two consecutive memory states, an increasing total polarization, $P_{SW}$, range increase the number of possible memory states. As shown, the total polarization, $P_{SW}$, range may saturate at about 50 µC/cm². This results from the change of the slope from substantially linear to s-shape, as illustrated in the graphs 502, 504, 506, and 508 in FIG. 5C.

Graph 514 shows the nonlinearity, NL; of the polarization curve as a function of the capacitance ratio, CR. As illustratively shown, there may be a minimum non-linearity in a range from about 3 to about 6.

As detailed herein, it may be desired to have both, a substantially linear shape of the polarization curve (in some aspects referred to as writing curve) as well as a large total polarization, $P_{SW}$, range to achieve a high number of possible memory states. Graph 516 shows a ratio of the normalized total polarization, $P_{SW}$, range to the nonlinearity as a function of the capacitance ratio, CR. As illustratively shown, there may be an optimum capacitance ratio, CR, at about 6.

Thus, in this exemplary case of ferroelectric hafnium oxide, there may be a capacitance ratio, CR, range from about 3 to about 9 which allows to achieve a linear writing curve with three or more than three memory states. An optimum CR may be about 6. It is understood that these values are exemplary for the material properties of ferroelectric hafnium oxide and may vary for other materials and/or other configurations of the SPOC 104 and/or other configurations of the memory cell.

In this exemplary determination of the CR range, the nonlinearity may be decreased (e.g., minimized) and the total polarization, $P_{SW}$, range may be increased (e.g., maximized). This may be achieved by defining an optimum CR as a maximum of the ratio of the normalized total polarization, $P_{SW}$, range to the nonlinearity (i.e., $$\frac{P_{SW}}{NL}).$$

According to various aspects, the voltage range of range size, $V_{B2}-V_{B1}$, may be divided into a plurality of subranges of a same subrange size, wherein each subrange of the plurality of subranges may be associated with a respective memory state of the three or more memory states. Graph 512 shows (for the present example of ferroelectric hafnium oxide) a number of states as a function of the capacitance ratio, CR, when assuming a subrange size of 5 $\mu C/cm^2$. Illustratively, the memory cell can be in one of eight states when using the optimum CR of about 6.

For illustration, a linear coefficient, $S_n$, may be defined, wherein "n" refers to the $n^{th}$ memory state.

Table 1 shows an exemplary first approach for writing an $n^{th}$ memory state of the memory cell and for reading the memory state:

| Write/Read | Wordline voltage | Bitline voltage, $V_{BL}$ | Plateline voltage, $V_{PL}$ | Write modification circuit 202 |
|---|---|---|---|---|
| $W_{+n}$ | $V_{WL}$ | $S_n \cdot V_{dd}$ | 0 | provide write capacitance, $C_W$ |
| $W_{-n}$ | $V_{WL}$ | 0 | $S_n \cdot V_{dd}$ | provide $C_W$ |
| $R_{-n \; to \; +n}$ | $V_{WL}$ | sense $V_{BL}$ | $V_{dd}$ | do not provide $C_W$ (e.g., activate switch 210) |

Table 2 shows an exemplary second approach for writing an $n^{th}$ memory state of the memory cell and for reading the memory state:

| Write/Read | Wordline voltage | Bitline voltage, $V_{BL}$ | Plateline voltage, $V_{PL}$ | Write modification circuit 202 |
|---|---|---|---|---|
| $W_n$ | $V_{WL}$ | $S_n \cdot V_{dd}$ | 0 | provide write capacitance, $C_W$ |
| $W_0$ | $V_{WL}$ | 0 | $V_{dd}$ | provide $C_W$ |
| $R_{0 \; to \; +n}$ | $V_{WL}$ | sense $V_{BL}$ | $V_{dd}$ | do not provide $C_W$ (e.g., activate switch 210) |

Various aspects detailed herein refer to a write modification circuit 202 which allows to provide a write capacitance, $C_W$, during writing a memory cell and to not provide the write capacitance, $C_W$, during reading the memory cell. This write capacitance, $C_W$, is provided in series with the SPOC capacitance, $C_{SPOC}$, of the SPOC 104, therefore providing a capacitive (voltage) divider. Therefore, this approach may also be referred to as capacitive (voltage) divider approach. As detailed herein, this approach allows to achieve a linear writing curve, wherefore three or more than three memory states can be defined. Further, as detailed with reference to FIG. 5C, the approach is suitable for low dimensions (e.g., below 1 $\mu m^2$) of the memory element 124.

According to various, the write modification circuit 202 may include a plurality of write capacitors 208($n$=1 to N) (with N>1). As detailed herein, the writing curve may be a function of CR. Selecting different combinations of one or more write capacitors of the plurality of write capacitors 208($n$=1 to N) allows to modify the capacitance ratio, CR. Thus, using a write modification circuit 202 which includes a plurality of write capacitors 208($n$=1 to N) may allow to modify the writing curve during use of the memory cell arrangement.

Optionally, the control circuit 302 may be configured to apply, during writing a memory state, voltage pulses of different voltage values than during reading the memory state of a memory cell.

Figure 6:
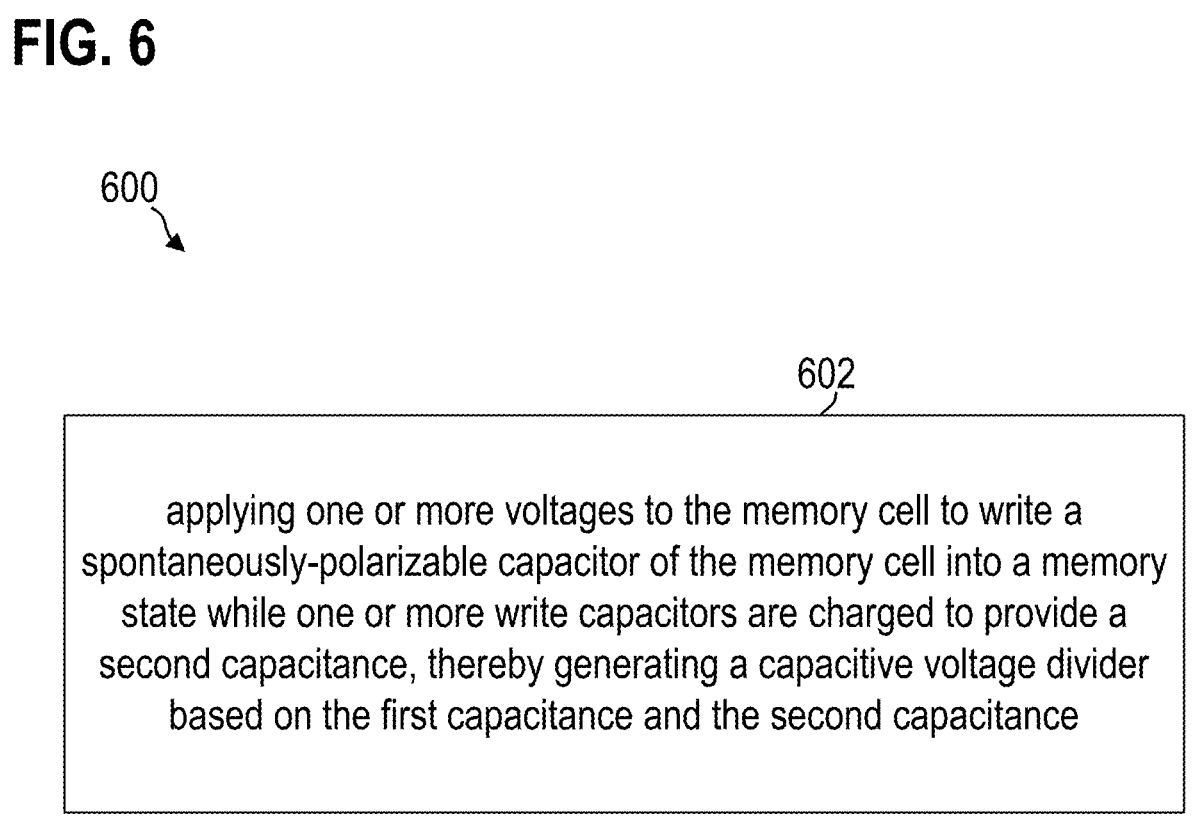

FIG. 6 shows a flow diagram of a method 600 of writing a memory cell. The memory cell may include a spontaneously-polarizable (e.g., ferroelectric) capacitor having a first capacitance.

The method 600 may include (in 602) applying one or more voltages to the memory cell to write the spontaneously-polarizable capacitor into a memory state while (at a same time) one or more write capacitors (being in parallel to one another and in series with spontaneously-polarizable capacitor) are charged (e.g., activated) to provide a second capacitance, thereby generating a capacitive voltage divider based on the first capacitance and the second capacitance.

Optionally, the method 600 may include reading the memory state of the memory cell by applying one or more voltages to the memory cell while (at a same time) the one or more write capacitors are deactivated.

Figure 7:
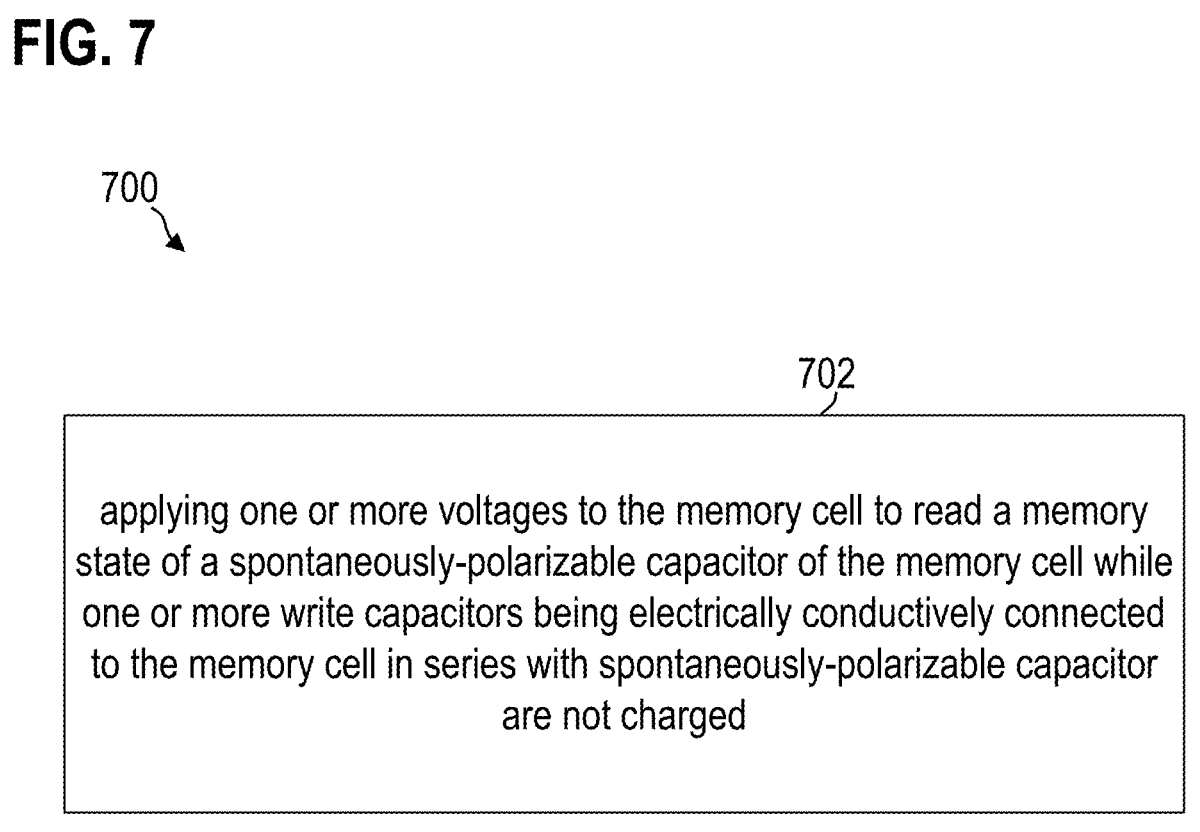

FIG. 7 shows a flow diagram of a method 700 of reading a memory cell. The memory cell may include a spontaneously-polarizable (e.g., ferroelectric) capacitor having a first capacitance.

The method 700 may include (in 702) applying one or more voltages to the memory cell to read a memory state of the spontaneously-polarizable capacitor while (at a same time) one or more write capacitors (being in parallel to one another and) being electrically conductively connected to the memory cell in series with spontaneously-polarizable capacitor are not charged.

Optionally, the method 700 may include writing the memory cell into another memory state different from the memory state by applying one or more voltages to the memory cell while (at a same time) the one or more write capacitors are activated to provide a second capacitance, thereby generating a capacitive voltage divider based on the first capacitance and the second capacitance.

Figure 8:
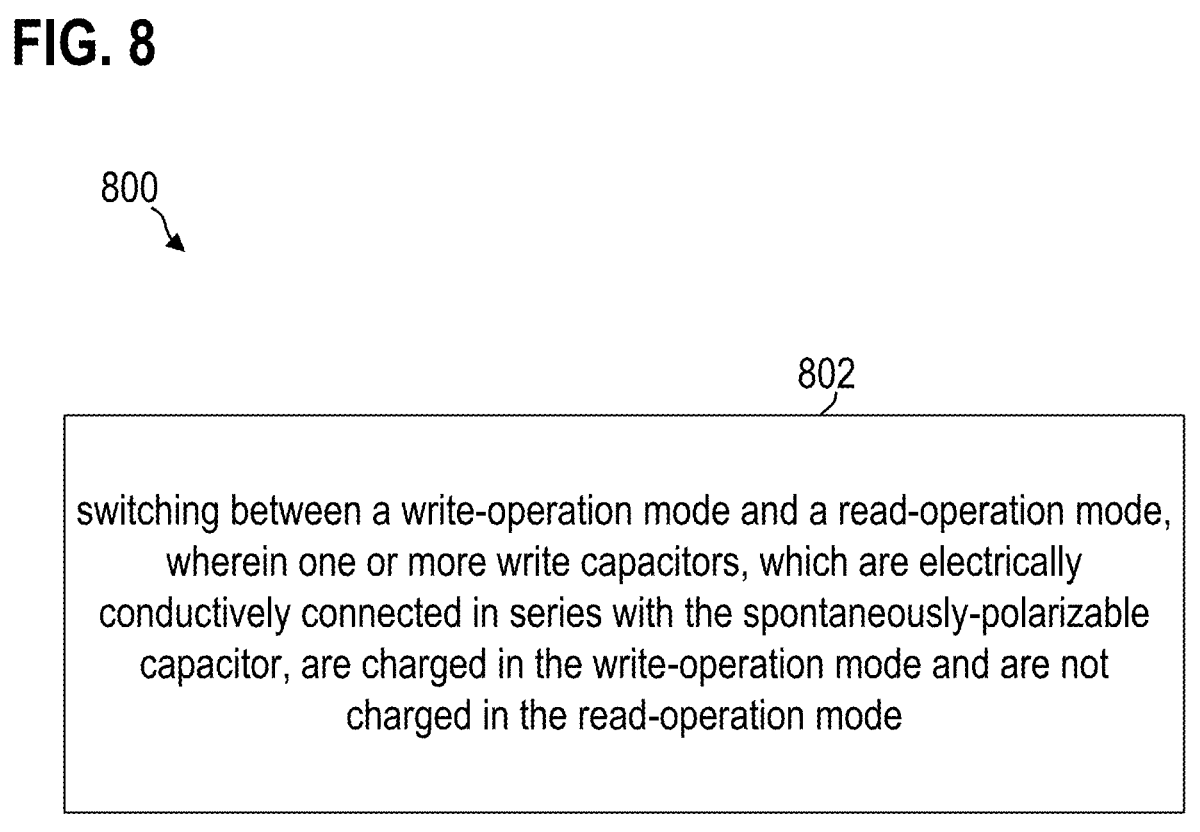

FIG. 8 shows a flow diagram of a method 800 of operating a memory cell. The memory cell may include a spontaneously-polarizable (e.g., ferroelectric) capacitor (e.g., having a first capacitance).

The method 800 may include (in 802) switching between a write-operation mode and a read-operation mode (e.g., from the write-operation mode to the read-operation mode or vice versa), wherein one or more write capacitors, which are electrically conductively connected in series with the spontaneously-polarizable capacitor, are charged in the write-operation mode (e.g., to provide a second capacitance in the write-operation mode) and are not charged in the read-operation mode (e.g., to not provide the second capacitance in the read-operation mode). In the following, various examples are provided that may include one or more aspects described above with reference to a memory cell including the SPOC structure 120, to a memory cell arrangement including such a memory cell and one or more write modification circuits, and to the methods described herein. It may be intended that aspects described in relation to one or more of the methods may apply also to the memory cell arrangement, and vice versa. For example, a method may include an execution of one or more functions a component of the memory cell arrangement (e.g., the one or more write modification circuits) is configured to.

Example 1 is a memory cell arrangement including: a memory cell including: a field-effect transistor, FET, including a gate terminal, a first source/drain terminal, and a second source/drain terminal, and a spontaneously-polarizable (e.g., ferroelectric) capacitor connected to the first source/drain terminal of the field-effect transistor, the spontaneously-polarizable capacitor having a first capacitance; and a write modification circuit electrically conductively connected to the second source/drain terminal or to the spontaneously-polarizable capacitor, wherein the write modification circuit includes a write capacitor having a second capacitance (different from the first capacitance) and wherein the write modification circuit is configured to selectively provide the second capacitance when the memory cell is written (e.g., but not when the memory cell is read). This allows to generate, when the memory cell is written, a capacitive voltage divider based on the first capacitance and the second capacitance.

In Example 2, the memory cell arrangement of Example 1 can optionally further include: a control line (e.g., a bitline or a plateline) connected to the write modification circuit.

In Example 3, the subject matter of Example 1 or 2 can optionally include that a ratio of the second capacitance to the first capacitance is in a range from about 3 to about 9.

In Example 4, the subject matter of Example 3 can optionally include that the ratio of the second capacitance to the first capacitance is about 6.

In Example 5, the subject matter of any one of Examples 1 to 4 can optionally include that the write capacitor is one of: a dielectric (e.g., non-ferroelectric) capacitor, a ferroelectric capacitor, an antiferroelectric capacitor, a metal-oxide-semiconductor gate.

In Example 6, the subject matter of any one of Examples 1 to 5 can optionally include that the write modification circuit further includes a switch connected in parallel to the write capacitor.

In Example 7, the subject matter of Example 6 can optionally include that the write modification circuit is configured to: select the write capacitor to provide the second capacitance when the memory cell is written; and select and close the switch to not provide the second capacitance when the memory cell is read.

In Example 8, the subject matter of Example 7 can optionally include that the write modification circuit includes a selector circuit configured to select either the write capacitor or the switch.

In Example 9, the memory cell arrangement of any one of Examples 1 to 8 can optionally further include: a control (e.g., read/write) circuit configured to carry out: a read-out operation to read out a memory state of the memory cell, the read-out operation including controlling the write modification circuit to not provide the second capacitance; and/or a write operation to write the memory state of the memory cell, the write operation including controlling the write modification circuit to provide the second capacitance.

In Example 10, the subject matter of any one of Examples 1 to 9 can optionally include that the write modification circuit is (electrically conductively) connected to the second source/drain terminal.

In Example 11, the subject matter of Examples 2 and 10 can optionally include that the write modification circuit includes a first node connected to the second source/drain terminal and a second node connected to the control line (e.g., bitline); or wherein the write modification circuit is connected to the second source/drain terminal via the control line (e.g., bitline).

In Example 12, the subject matter of any one of Examples 1 to 9 can optionally include that the write modification circuit is (electrically conductively) connected to the spontaneously-polarizable (e.g., ferroelectric) capacitor.

In Example 13, the subject matter of Example 12 can optionally include that the write modification circuit includes a first node (electrically conductively) connected to the first source/drain terminal and a second node (electrically conductively) connected to the spontaneously-polarizable capacitor.

In Example 14, the subject matter of Examples 2 and 12 can optionally include that the write modification circuit includes a first node (electrically conductively) connected to the spontaneously-polarizable capacitor and a second node (electrically conductively) connected to the control line (e.g., plateline); or wherein the write modification circuit is (electrically conductively) connected to the spontaneously-polarizable capacitor via the control line (e.g., plateline).

In Example 15, the subject matter of any one of Examples 1 to 14 can optionally include that the memory cell is writable into one of at least three (different) memory states, wherein each of the at least three memory states is associated with a respective charge stored in the spontaneously-polarizable capacitor.

In Example 16, the subject matter of any one of Examples 1 to 15 can optionally include that the memory cell arrangement includes a plurality of memory cells which are in a ferroelectric random-access memory, FeRAM, arrangement. The memory cell arrangement may further include an addressing circuit configured to randomly access one or more memory cells of the plurality of memory cells.

In Example 17, the subject matter of any one of Examples 1 to 16 can optionally include that the write modification circuit is connected in series with the spontaneously-polarizable capacitor.

In Example 18, the subject matter of any one of Examples 1 to 17 can optionally include that a ratio of the second capacitance to the first capacitance is such that, when writing the memory cell, a switching polarization of the spontaneously-polarizable (e.g., ferroelectric) capacitor is a substantially linear function of a voltage applied over the spontaneously-polarizable capacitor in a voltage range having a range size equal to or greater than half a coercive voltage $$\left( \frac{V_C}{2} \right)$$

of the spontaneously polarizable capacitor. The range size may be equal to or greater than about two times the coercive voltage ($2V_c$). In some aspects, the range size may be at least two volts.

In Example 19, the subject matter of any one of Examples 1 to 18 can optionally include that the spontaneously-polarizable capacitor includes a spontaneously-polarizable (e.g., ferroelectric) portion disposed between two electrodes.

In Example 20, the subject matter of Example 19 can optionally include that the spontaneously polarizable portion substantially consists of one or more transition metal oxides.

In Example 21, the subject matter of Example 19 or 20 can optionally include that the spontaneously polarizable portion is made of a remanent-polarizable material.

In Example 22, the subject matter of any one of Examples 19 to 21 can optionally include that the spontaneously polarizable portion is made of hafnium oxide, zirconium oxide, or hafnium zirconium oxide.

In Example 23, the subject matter of any one of Examples 19 to 22 can optionally include that the spontaneously polarizable capacitor has an effective capacitance area (e.g., that the spontaneously-polarizable portion extends parallel to the two electrodes over an area) of equal to or less than about one $\mu m^2$ (e.g., equal to or less than about 0.25 $\mu m^2$, e.g., equal to or less than about 0.04 $\mu m^2$, e.g., equal to or less than about 0.01 $\mu m^2$).

In Example 24, the subject matter of any one of Examples 1 to 23 can optionally include that the memory cell includes the write modification circuit.

In Example 25, the memory cell arrangement of any one of Examples 1 to 24 can optionally further include: one or more additional memory cells, wherein each of the one or more additional memory cells is configured in accordance with the memory cell; a control line connected to the memory cell and each of the one or more additional memory cells; and one or more additional write modification circuits, wherein each of the one or more additional write modification circuits is configured in accordance with the write modification circuit, wherein a respective additional write modification circuit of the one or more additional write modification circuits is connected between a corresponding memory cell of the one or more additional memory cells and the control line.

In Example 26, the memory cell arrangement of any one of Examples 1 to 24 can optionally further include: one or more additional memory cells, wherein each of the one or more additional memory cells is configured in accordance with the memory cell; and a control line connected to the memory cell and each of the one or more additional memory cells, wherein the write modification circuit is connected to the memory cell and each of the one or more additional memory cells via the control line.

Example 27 is a memory cell arrangement including: a memory cell including: a field-effect transistor, FET, including a gate terminal, a first source/drain terminal, and a second source/drain terminal, and a spontaneously-polarizable (e.g., ferroelectric) capacitor connected to the first source/drain terminal of the field-effect transistor, the spontaneously-polarizable capacitor having a corresponding (e.g., first) capacitance; and a write modification circuit electrically conductively connected to the second source/drain terminal or the spontaneously-polarizable capacitor, wherein the write modification circuit includes: a plurality of write capacitors, wherein each write capacitor of the plurality of write capacitors has a respective capacitance; wherein the write modification circuit is configured to select one or more write capacitors of the plurality of write capacitors to provide an effective write capacitance when the memory cell is written. The effective write capacitance (in some aspects referred to as second capacitance) may be an equivalent capacitance of the one or more write capacitors. Optionally, the write modification circuit may be configured to select none of the plurality of write capacitors when the memory cell is read.

The write capacitors of the plurality of write capacitors may be connected in parallel to one another.

In Example 28, the subject matter of Example 27 can optionally include that at least two write capacitors of the plurality of write capacitors have a respective capacitance different from one another (e.g., the respective capacitance of each write capacitor of the plurality of write capacitors may be different from the capacitances of the other write capacitors).

In Example 29, the memory cell arrangement of Example 27 or 28 can optionally further include: a control line (e.g., a bitline or a plateline) connected to the write modification circuit.

In Example 30, the subject matter of any one of Examples 27 to 29 can optionally include that a ratio of the effective write capacitance (second capacitance) to the corresponding capacitance (first capacitance) is in a range from about 3 to about 9 (e.g., about 6).

In Example 31, the subject matter of any one of Examples 27 to 30 can optionally include that at least one (e.g., each) write capacitor of the plurality of write capacitors is one of: a dielectric (e.g., non-ferroelectric) capacitor, a ferroelectric capacitor, an antiferroelectric capacitor, a metal-oxide-semiconductor gate.

In Example 32, the subject matter of any one of Examples 27 to 31 can optionally include that the write capacitors of the plurality of write capacitors are connected in parallel to each other.

In Example 33, the subject matter of any one of Examples 27 to 32 can optionally include that the write modification circuit further includes a switch connected in parallel to the plurality of write capacitors.

In Example 34, the subject matter of Example 33 can optionally include that the write modification circuit is configured to: select the one or more write capacitors of the plurality of write capacitors to provide the effective write capacitance (second capacitance) when the memory cell is written; and select and close the switch (to not provide the effective write capacitance) when the memory cell is read.

In Example 35, the subject matter of Example 34 can optionally include that the write modification circuit includes a selector circuit configured to select either the switch or the one or more write capacitors.

In Example 36, the memory cell arrangement of any one of Examples 27 to 35 can optionally further include: a control (e.g., read/write) circuit configured to carry out: a read-out operation to read out a memory state of the memory cell, the read-out operation including controlling the write modification circuit to not provide the effective write capacitance (second capacitance); and/or a write operation to write the memory state of the memory cell, the write operation including controlling the write modification circuit to provide the effective write capacitance.

In Example 37, the subject matter of any one of Examples 27 to 36 can optionally include that the write modification circuit is (electrically conductively) connected to the second source/drain terminal.

In Example 38, the subject matter of Examples 29 and 37 can optionally include that the write modification circuit includes a first node connected to the second source/drain terminal and a second node connected to the control line (e.g., bitline); or wherein the write modification circuit is connected to the second source/drain terminal via the control line (e.g., bitline).

In Example 39, the subject matter of any one of Examples 27 to 37 can optionally include that the write modification circuit is (electrically conductively) connected to the spontaneously-polarizable (e.g., ferroelectric) capacitor.

In Example 40, the subject matter of Example 39 can optionally include that the write modification circuit includes a first node (electrically conductively) connected to the first source/drain terminal and a second node (electrically conductively) connected to the spontaneously-polarizable capacitor.

In Example 41, the subject matter of Examples 29 and 39 can optionally include that the write modification circuit includes a first node (electrically conductively) connected to the spontaneously-polarizable capacitor and a second node (electrically conductively) connected to the control line (e.g., plateline); or wherein the write modification circuit is (electrically conductively) connected to the spontaneously-polarizable capacitor via the control line (e.g., plateline).

In Example 42, the subject matter of any one of Examples 27 to 41 can optionally include that the memory cell is writable into one of at least three (different) memory states, wherein each of the at least three memory states is associated with a respective charge stored in the spontaneously-polarizable capacitor.

In Example 43, the subject matter of any one of Examples 27 to 42 can optionally include that the memory cell arrangement includes a plurality of memory cells which are in a ferroelectric random-access memory, FeRAM, arrangement. The memory cell arrangement may further include an addressing circuit configured to randomly access one or more memory cells of the plurality of memory cells.

In Example 44, the subject matter of any one of Examples 27 to 43 can optionally include that the write modification circuit is connected in series with the spontaneously-polarizable capacitor.

In Example 45, the subject matter of any one of Examples 27 to 44 can optionally include that a ratio of the effective write capacitance (second capacitance) to the corresponding capacitance (first capacitance) is such that, when writing the memory cell, a switching polarization of the spontaneously-polarizable (e.g., ferroelectric) capacitor is a substantially linear function of a voltage applied over the spontaneously-polarizable capacitor in a voltage range having a range size equal to or greater than half a coercive voltage $$\left(\frac{V_C}{2}\right)$$

of the spontaneously polarizable capacitor. The range size may be equal to or greater than about two times the coercive voltage ($2V_c$). In some aspects, the range size may be at least two volts.

In Example 46, the subject matter of any one of Examples 27 to 45 can optionally include that the spontaneously-polarizable capacitor includes a spontaneously-polarizable (e.g., ferroelectric) portion disposed between two electrodes.

In Example 47, the subject matter of Example 46 can optionally include that the spontaneously polarizable portion substantially consists of one or more transition metal oxides.

In Example 48, the subject matter of Example 46 or 47 can optionally include that the spontaneously polarizable portion is made of a remanent-polarizable material.

In Example 49, the subject matter of any one of Examples 46 to 48 can optionally include that the spontaneously polarizable portion is made of hafnium oxide, zirconium oxide, or hafnium zirconium oxide.

In Example 50, the subject matter of any one of Examples 27 to 49 can optionally include that the spontaneously polarizable capacitor has an effective capacitance area (e.g., that the spontaneously-polarizable portion extends parallel to the two electrodes over an area) of equal to or less than about one $\mu m^2$ (e.g., equal to or less than about 0.25 $\mu m^2$, e.g., equal to or less than about 0.04 $\mu m^2$, e.g., equal to or less than about 0.01 $\mu m^2$).

In Example 51, the subject matter of any one of Examples 27 to 50 can optionally include that the memory cell includes the write modification circuit.

In Example 52, the memory cell arrangement of any one of Examples 27 to 51 can optionally further include: one or more additional memory cells, wherein each of the one or more additional memory cells is configured in accordance with the memory cell; a control line connected to the memory cell and each of the one or more additional memory cells; and one or more additional write modification circuits, wherein each of the one or more additional write modification circuits is configured in accordance with the write modification circuit, wherein a respective additional write modification circuit of the one or more additional write modification circuits is connected between a corresponding memory cell of the one or more additional memory cells and the control line.

In Example 53, the memory cell arrangement of any one of Examples 27 to 51 can optionally further include: one or more additional memory cells, wherein each of the one or more additional memory cells is configured in accordance with the memory cell; and a control line connected to the memory cell and each of the one or more additional memory cells, wherein the write modification circuit is connected to the memory cell and each of the one or more additional memory cells via the control line.

Example 54 is a device (e.g., for multi-level storage and/or artificial intelligence (e.g., neuromorphic) applications) including the memory cell arrangement according to any one of Examples 1 to 53.

Example 55 is a method of operating a memory cell which includes a spontaneously-polarizable (e.g., ferroelectric) capacitor having a first capacitance, the method including: writing a memory state (of at least three (different) memory states) of the memory cell by applying one or more voltages to the memory cell while (at a same time) providing a second capacitance using one or more write capacitors (being in parallel to one another and in series with spontaneously-polarizable capacitor), thereby generating a capacitive voltage divider based on the first capacitance and the second capacitance; and/or reading a memory state (of at least three (different) memory states) of the memory cell by applying one or more voltages to the memory cell while (at a same time) one or more write capacitors (being in parallel to one another and) being electrically conductively connected to the memory cell in series with spontaneously-polarizable capacitor are not charged.

Example 56 is a method of writing a memory cell which includes a spontaneously-polarizable (e.g., ferroelectric) capacitor having a first capacitance, the method including: applying one or more voltages to the memory cell to write the spontaneously-polarizable capacitor into a memory state (of at least three (different) memory states) while (at a same time) providing a second capacitance using one or more write capacitors (being in parallel to one another and in series with spontaneously-polarizable capacitor), thereby generating a capacitive voltage divider based on the first capacitance and the second capacitance.

Example 57 is a method of writing a memory cell which includes a spontaneously-polarizable (e.g., ferroelectric) capacitor having a first capacitance, the method including: applying one or more voltages to the memory cell to write the spontaneously-polarizable capacitor into a memory state (of at least three (different) memory states) while (at a same time) charging one or more write capacitors (being in parallel to one another and in series with spontaneously-polarizable capacitor) to generate a second capacitance.

In Example 58, the method of Example 56 or 57 can optionally further include: reading the memory state of the memory cell by applying one or more voltages to the memory cell while (at a same time) the one or more write capacitors are not charged.

Example 59 is a method of reading a memory cell which includes a spontaneously-polarizable (e.g., ferroelectric) capacitor having a corresponding (first) capacitance, the method including: applying one or more voltages to the memory cell to read a memory state (of at least three (different) memory states) of the spontaneously-polarizable capacitor while (at a same time) one or more write capacitors (being in parallel to one another and) being electrically conductively connected to the memory cell in series with spontaneously-polarizable capacitor are not charged.

In Example 60, the method of Example 59 can optionally further include: writing the memory cell into another memory state different from the memory state by applying one or more voltages to the memory cell while (at a same time) the one or more write capacitors are charged to provide a write (second) capacitance (thereby generating a capacitive voltage divider based on the corresponding (first) capacitance and the write (second) capacitance).

Example 61 is a method of operating a memory cell which includes a spontaneously-polarizable (e.g., ferroelectric) capacitor (having a first capacitance), the method including: switching between a write-operation mode and a read-operation mode (e.g., from the write-operation mode to the read-operation mode or vice versa), wherein one or more write capacitors, which are (electrically conductively) connected in series with the spontaneously-polarizable capacitor, are charged in the write-operation mode and are not charged in the read-operation mode.

Example 62 is a control circuit including a voltage source and a write modification circuit. The voltage source may be configured to generate one or more voltage pulses. The write modification circuit may be configured in accordance with any one of the Examples 1 to 61. The control circuit may be configured to carry out a write operating (to set a memory state) in which one or more voltage pulses are applied to at least one memory cell and in which the write modification circuit provides the write capacitance, $C_W$. The control circuit may optionally be further configured to carry out a read operation (to read the memory state) in which one or more voltage pulses are applied to the at least one memory cell and in which the write modification circuit does not provide the write capacitance, $C_W$.

In Example 63, the subject matter of any one of Examples 1 to 62 may, where applicable, optionally include that the second capacitance is not provided when the memory cell is read (e.g., write modification circuit may be configured accordingly, e.g., by not selecting the write capacitor/the one or more write capacitors when the memory cell is read).

In Example 64, the subject matter of any one of Examples 1 to 63 may, where applicable, optionally include that at least one (e.g., each) write capacitor may include a layer stack. The layer stack may, for example, include a capacitive element disposed between two electrically conductive electrodes.

Several aspects are described with reference to a structure (e.g., a memory transistor structure, e.g., a field-effect transistor structure, e.g., a ferroelectric field-effect transistor structure, e.g., a capacitive memory structure) and it is noted that such a structure may include solely the respective element (e.g., a memory transistor, e.g., a field-effect transistor, e.g., a ferroelectric field-effect transistor, e.g., a capacitive memory); or, in other aspects, a structure may include the respective element and one or more additional elements.

Various aspects refer to the verb "switch" may be used herein to describe a modification of the memory state a memory cell is residing in. For example, in the case that a memory cell is residing in a first memory state, the memory state the memory cell is residing in may be switched such that, after switching, the memory cell may reside in a second memory state, different from the first memory state. The verb "switch" may thus be used herein to describe a modification of the memory state a memory cell is residing in, from a first memory state to a second memory state. The verb "switch" may also be used herein to describe a modification of a polarization, for example of a spontaneously-polarizable memory element (e.g., of a spontaneously-polarizable layer, such as a remanent-polarizable layer). For example, a polarization of a spontaneously-polarizable memory element may be switched, such that the sign of the polarization varies from positive to negative or from negative to positive, while the absolute value of the polarization may remain in some aspects substantially unaltered. In other aspects, the sign of the polarization may not be changed but the absolute value of the polarization may be changed, thereby changing the memory state of the memory cell.

Various aspects refer to the noun "switch" with reference to an electronic component. The "switch" as an electronic component may be any electronic component allowing to either open or close an electric connection. For example, the "switch" may be a power electronic switch (for example a bidirectional power electronic switch). The power electronic switch may be, for example, a thyristor switch, a triac switch, an IGBT switch (power switch with a bipolar transistor with an insulated gate electrode), etc.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected". Various aspects refer to the write modification circuit (e.g., components thereof) being (electrically conductively) connected to a specific node or terminal.

The term "coupled to" used herein with reference to functional parts of a memory cell (e.g., functional parts of a memory structure) that are coupled to respective nodes (e.g., source-line node, bit-line node, and/or word-line node) of the memory cell may be understood as follows: the respective functional parts are electrically conductively connected to corresponding nodes and/or the respective functional parts itself provide the corresponding nodes. As an example, a source/drain node of a field-effect transistor memory structure may be electrically conductively connected to the source-line node of the memory cell or the source/drain node of the field-effect transistor memory structure may provide the source-line node of the memory cell. As another example, a source/drain node of the field-effect transistor memory structure may be electrically conductively connected to the bit-line node of the memory cell or the source/drain node of the field-effect transistor memory structure may provide the bit-line node of the memory cell.

The term "voltage" may be used herein with respect to "one or more bitline voltages", "one or more wordline voltages", "one or more plateline voltages", "one or more sourceline voltages", "one or more control line voltages", "one or more base voltages" and the like. As an example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "control line voltage" may be used herein to denote a voltage that is provided to a control line, e.g., of a memory cell arrangement (for example a "wordline voltage" may be provided to a "wordline", a "bitline voltage" may be provided to a bitline, and a "sourceline voltage" may be provided to a sourceline). The sign of a voltage difference (e.g., a voltage drop) may be defined as a potential inside a memory cell (e.g., at a first electrode portion) minus a potential at a second electrode portion of the memory cell.

Illustratively, a voltage provided to a node or a terminal may assume any suitable value depending on the intended operation of the circuit including the node or terminal. For example, a bitline voltage (referred to as $V_{BL}$ or $V_{BL}$) may be varied depending on the intended operation of the memory cell arrangement. Analogously, a wordline voltage (referred to as $V_{WL}$ or $V_{WL}$), a plateline voltage (referred to as $V_{PL}$ or VPL), and/or sourceline voltage (referred to as VSL or VSL) may be varied depending on the intended operation of a memory cell arrangement. A voltage provided to a node or terminal may be defined by the respective potential applied to that node or terminal relative to the base voltage (referred to as VB) of the circuit. Further, a voltage drop associated with two distinct nodes or terminals of a circuit may be defined by the respective voltages/potentials applied at the two nodes or terminals. As an example, a bitline voltage drop associated with a memory cell of a memory cell arrangement (e.g., an electrode of the memory cell) may be defined by the respective voltages/potentials applied at the corresponding memory cell (e.g., the electrode of the memory cell).

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison.

The phrase "a current between" a first terminal or node and a second terminal or node may be used herein to mean a current from the first terminal or node to the second terminal or node as well as a current from the second terminal or node to the first terminal or node.

The phrase "a current through" a terminal, node, or region may be used herein to mean a current from the terminal or node to another terminal, another node, or another region as well as a current to the terminal, node, or region (e.g., from another terminal, another node, or another region).

A current may be detected using a current sense amplifier that outputs a voltage proportional to the current.

The phrase that a layer "substantially consists of" a material, as used herein, may be understood to mean that the layer may include other materials; however, a concentration of the other materials may be significantly lower than a concentration of the material. That the layer "substantially consists of" the material may be understood to mean that the layer includes at least 80 at. % (e.g., at least 90 at. %, e.g., at least 95 at. %, e.g., about 100 at. %) of the material or more (hence, the concentration of the material may be equal to or greater than 80 at. %). For example, a layer that substantially consists of hafnium oxide may consist of hafnium zirconium oxide, $Hf_{1-x}Zr_xO_2$, with $0.8 \le x \le 1$. It may be understood that even in the case that a layer substantially consists of a specific material (e.g., zirconium oxide ($ZrO_2$), one or more other materials may diffuse from a neighboring layer into the layer such that the layer may include a small number of atoms of the one or more other materials.

As used herein, a "concentration" of an element (e.g., of a transition metal) may refer to an atomic percentage (in at. %) of the element. Thus, in the case that the concentration of one element is compared to the concentration of another element, the atomic percentage of the one element may be compared to the atomic percentage of the other element. It is understood that a relation between the atomic percentage of the one element and the atomic percentage of the other element may directly refer to an atomic ratio between the one element and the other element. For example, in the case that the concentration (e.g., the atomic percentage) of the one element may be two times the concentration (e.g., the atomic percentage) of the other element, the atomic ratio between the one element and the other element may be 2 to 1 (2:1).

The term "metal" or "metal material" may be used herein to describe a metal (e.g., a pure or substantially pure metal) or a mixture of more than one metal, viz. a metal alloy. A "metal" may be an intermetallic material. Illustratively, the term "metal" may be used herein to describe a material having an electrical conductivity typical of a metal, for example an electrical conductivity greater than $10^6$ S/m at a temperature of 20° C. The term "metal material" may be used herein to describe a material having the Fermi level inside at least one band. Therefore, in some aspects, the term "metal" may refer to a metalloid (also referred to as half-metal or semi-metal).

The terms "electrically conducting" or "electrically conductive" may be used herein interchangeably to describe a material or a layer having an electrical conductivity or an average electrical conductivity greater than $10^6$ S/m at a temperature of 20° C. The term "electrically insulating" may be used herein interchangeably to describe a material or a layer having an electrical conductivity or an average electrical conductivity less than $10^{10}$ S/m at a temperature of 20° C. In some aspects, a difference in electrical conductivity between an electrically conducting material (or layer) and an electrically insulating material (or layer) may have an absolute value of at least $10^{10}$ S/m at a temperature of 20° C., or of at least $10^{15}$ S/m at a temperature of 20° C.

The expression "a material of an element" or "a material of a layer", for example "a material of a memory element", or "a material of an electrode layer" may be used herein to describe a main component of that element or layer, e.g., a main material (for example, a main element or a main compound) present in that element or layer. The expression "a material of an element" or "a material of a layer" may describe, in some aspects, the material of that element or layer having a weight percentage greater than 60% over the total weight of the materials that the element or layer includes. The expression "a material of an element" or "a material of a layer" may describe, in some aspects, the material of that element or layer having a volume percentage greater than 60% over the total volume of the materials that the element or layer includes. As an example, a material of an element or layer including aluminum may describe that that element or layer is formed mostly by aluminum, and that other elements (e.g., impurities) may be present in a smaller proportion, e.g., having less weight percentage or less volume percentage compared to aluminum. As another example, a material of an element or layer including titanium nitride may describe that that element or layer is formed mostly by titanium nitride, and that other elements (e.g., impurities) may be present in a smaller proportion, e.g., having less weight percentage or less volume percentage compared to titanium nitride.

The term "region" used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.). In some aspects, the continuous region of a semiconductor portion may be provided by semiconductor material having only one dominant doping type.

The word "over", used herein to describe forming a feature, e.g., a layer "over" a side or surface, may be used to mean that the feature, e.g., the layer, may be formed "directly on", e.g., in direct contact with, the implied side or surface. The word "over", used herein to describe forming a feature, e.g., a layer "over" a side or surface, may be used to mean that the feature, e.g., the layer, may be formed "indirectly on" the implied side or surface with one or more additional layers being arranged between the implied side or surface and the formed layer.

The term "lateral" used with regards to a lateral dimension (in other words a lateral extent) of a structure, a portion, a structure element, a layer, etc., provided, for example, over and/or in a carrier (e.g., a layer, a substrate, a wafer, etc.) or "laterally" next to, may be used herein to mean an extent or a positional relationship along a surface of the carrier. That means, in some aspects, that a surface of a carrier (e.g., a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. Further, the term "height" used with regards to a height of a structure, a portion, a structure element, a layer, etc., may be used herein to mean a dimension (in other words an extent) of a structure in a direction perpendicular to the surface of a carrier (e.g., perpendicular to the main processing surface of a carrier).

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g., parallel to the main processing surface) the "thickness" of the layer formed on the surface of the support may be the same as the height of the layer.

According to various aspects, various properties (e.g., physical properties, chemical properties, etc.) of a first component (e.g., elements, layers, structures, portions, etc.) and a second component may be compared to one another. It may be found that two or more components may be—with reference to a specific property—either equal to each other or different from one another. As a measure, a value that represents such a property may be either equal or not. In general, a skilled person may understand from the context of the application whether two values or properties are equal or not, e.g., usually, if values are in the range of a usual tolerance, they may be regarded equal. However, in some aspects or as long as not otherwise mentioned or understood, two values that differ from one another with at least 1% relative difference may be considered different from one another. Accordingly, two values that differ from one another with less than 1% relative difference may be considered equal to each other.

It may be understood, that the physical term "electrical conductivity" (also referred to as specific conductance, specific electrical conductance, as examples) may be defined as a material dependent property reciprocal to the physical term "electrical resistivity" (also referred to as specific electrical resistance, volume resistivity, as examples). Further properties of a layer or structure may be defined material dependent and the geometry dependent, e.g., by the physical terms "electrical resistance" and "electrical conductance".

According to various aspects, the properties and/or the structure of the memory element, an electrode, an electrically conductive electrode layer, and/or a functional layer as described herein may be evaluated with techniques known in the art. As an example, transmission electron microscopy (TEM) may be used to determine the structure of an electrode, for example the presence of one or more electrode layers and/or the presence of one or more functional layers in the electrode. TEM may be used for identifying a layer, an interface, a crystal structure, a microstructure, and other properties. As another example, X-ray crystallography (X-ray diffraction) may be used to determine various properties of a layer or a material, such as the crystal structure, the lattice properties, the size and shape of a unit cell, the chemical composition, the phase or alteration of the phase, the presence of stress in the crystal structure, the microstructure, and the like. As a further example, energy-dispersive X-ray spectroscopy (EDS) may be used to determine the chemical composition of a layer or a material, e.g. the presence and/or the content of an element in the layer or material. As a further example, Rutherford backscattering spectrometry (RBS) may be used to determine the structure and/or the composition of a material. As a further example, secondary ion mass spectrometry (SIMS) may be used to analyze the molecular composition of the upper monolayers of a solid, e.g. for analyzing the spatial distribution (e.g., the gradient) of an element across the solid.

A composition of a layer, a concentration of one or more materials within the layer, a composition of a layer, and/or a concentration of one or more materials within the spontaneously polarizable memory element, etc. may be determined with techniques known in the art. For example, energy-dispersive X-ray spectroscopy (EDS) (e.g., in combination with scanning electron microcopy (SEM) or transmission electron microscopy (TEM)), Rutherford backscattering spectrometry (RBS), and/or secondary ion mass spectrometry (SIMS) may be used to analyze the composition and/or concentration. However, the composition of the layer, the concentration of the one or more materials within the layer, the composition of the spontaneously polarizable memory element, and/or the concentration of the one or more materials within the spontaneously polarizable memory element may be also apparent from a manufacturing protocol for manufacturing the respective layer. For example, a layer may be manufactured by means of deposition, such as atomic layer deposition (ALD) and the respective composition and/or concentration may be directly apparent from the used deposition protocol (e.g., the used ALD deposition protocol).

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The phrase that an element or a group of elements "includes" another element or another group of elements may be used herein to mean that the other element or other group of elements may be part of the element or the group of elements or that the element or the group of elements may be configured or formed as the other element or the other group of elements (e.g., the element may be the other element).

The phrase "unambiguously assigned" may be used herein to mean a one-to-one-assignment (e.g., allocation, e.g., correspondence) or a bijective assignment. As an example, a first element being unambiguously assigned to a second element may include that the second element is unambiguously assigned to the first element. As another example, a first group of elements being unambiguously assigned to a second group of element may include that each element of the first group of elements is unambiguously assigned to a corresponding element of the second group of elements and that that corresponding element of the second group of elements is unambiguously assigned to the element of the first group of elements.

The terms "charging" or "discharging" an element having a capacitance associated therewith (such as a control line, an electrode, a terminal, etc., in an electronic circuit) may be used herein with respect to increase (in case of charging) or decrease (in case of discharging) the amount of electric charge stored in the element, for example. The electric charge stored in the element (based on the capacitance associated therewith) may be changed via a charging current or discharging current accordingly. In the case that an element having a capacitance associated therewith has an amount of electric charge stored therein, a corresponding voltage may be associated therewith as well. The relationship between a voltage of an element having a capacitance associated therewith (e.g., of a capacitor or an element having an inherent capacitance) and the electric charge stored therein may be determined based on commonly used equations considering the capacitance as a ratio of a change in electric charge to a corresponding change in the electric potential. The terms "charging" or "discharging" with reference to an element having a capacitance associated therewith may be used herein with respect to a technical current direction. The term "charge" or "charging" with reference to an element having a capacitance associated therewith, such as a control line, may be used herein to mean an increase of a voltage value being present (e.g., measureable) at the element, e.g., at the control line. The increase of the voltage value may mean a more positive voltage value: For example, an element having a capacitance associated therewith may be charged from a voltage value of −8V to a voltage value of −4V, from a voltage value of −2V to a voltage value of 2V, or from a voltage value of 3V to a voltage value of 6V (only as numerical examples). The term "discharge" or "discharging" with reference to an element having a capacitance associated therewith, such as a control line, may be used herein to mean a decrease of a voltage value being present (e.g., measurable) at the element, e.g., at the control line. The decrease of the voltage value may mean a more negative voltage value: For example, an element having a capacitance associated therewith may be discharged from a voltage value of 8V to a voltage value of 4V, from a voltage value of 2V to a voltage value of −2V, or from a voltage value of −3V to a voltage value of −6V (only as numerical examples).

It is noted that one or more functions described herein with reference to a memory cell, a memory cell arrangement, etc., may be accordingly part of a method, e.g., part of a method for operating a memory cell arrangement. Vice versa, one or more functions described herein with reference to a method, e.g., with reference to a method for operating a memory cell arrangement, may be implemented accordingly in a device or in a part of a device, for example, in a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell arrangement, comprising:
   a memory cell comprising:
      a field-effect transistor comprising a gate terminal, a first source/drain terminal, and a second source/drain terminal, and
      a spontaneously-polarizable capacitor connected to the first source/drain terminal of the field-effect transistor, the spontaneously-polarizable capacitor having a first capacitance; and
      a write modification circuit electrically conductively connected to the second source/drain terminal or to the spontaneously-polarizable capacitor, wherein the write modification circuit comprises a write capacitor having a second capacitance and wherein the write modification circuit is configured to selectively provide the second capacitance when the memory cell is written; wherein the second capacitance is greater than the first capacitance.

2. The memory cell arrangement according to claim 1, wherein the write modification circuit is configured to not provide the second capacitance when the memory cell is read.

3. The memory cell arrangement according to claim 1, wherein a ratio of the second capacitance to the first capacitance ranges from about 3 to about 9.

4. The memory cell arrangement according to claim 1, wherein the write capacitor is one of: a dielectric capacitor, a ferroelectric capacitor, an antiferroelectric capacitor, a metal-oxide-semiconductor gate.

5. The memory cell arrangement according to claim 1, wherein the write modification circuit further comprises a switch connected in parallel to the write capacitor; and wherein the write modification circuit is configured to:
    select the write capacitor to provide the second capacitance when the memory cell is written; and
    select and close the switch to not provide the second capacitance when the memory cell is read.

6. The memory cell arrangement according to claim 5, wherein the write modification circuit comprises a selector circuit configured to select either the write capacitor or the switch.

7. The memory cell arrangement according to claim 1, wherein the write modification circuit comprises a first node connected to the second source/drain terminal and a second node connected to a control line, or wherein the write modification circuit is connected to the second source/drain terminal via a control line.

8. The memory cell arrangement according to claim 1, wherein the write modification circuit comprises a first node connected to the first source/drain terminal and a second node connected to the spontaneously-polarizable capacitor; or wherein the write modification circuit comprises a first node connected to the spontaneously-polarizable capacitor and a second node connected to a control line; or wherein the write modification circuit is connected to the spontaneously-polarizable capacitor via a control line.

9. The memory cell arrangement according to claim 1, wherein the memory cell is writable into one of at least three memory states, wherein each of the at least three memory states is associated with a respective charge stored in the spontaneously-polarizable capacitor.

10. The memory cell arrangement according to claim 1, further comprising:
    a control circuit configured to carry out:
        a read-out operation to read out a memory state of the memory cell, the read-out operation comprising controlling the write modification circuit to not provide the second capacitance; and/or
        a write operation to write the memory state of the memory cell, the write operation comprising controlling the write modification circuit to provide the second capacitance.

11. The memory cell arrangement according to claim 1, wherein the write capacitor of the write modification circuit is connected in series with the spontaneously-polarizable capacitor.

12. The memory cell arrangement according to claim 1, wherein a ratio of the second capacitance to the first capacitance is such that, when writing the memory cell, a switching polarization of the spontaneously-polarizable capacitor is a substantially linear function of a voltage applied over the spontaneously-polarizable capacitor in a voltage range having a range size equal to or greater than half a coercive voltage of the spontaneously polarizable capacitor.

13. The memory cell arrangement according to claim 1, further comprising:

one or more additional memory cells, wherein each of the one or more additional memory cells is configured in accordance with the memory cell;
a control line connected to the memory cell and each of the one or more additional memory cells; and
one or more additional write modification circuits, wherein each of the one or more additional write modification circuits is configured in accordance with the write modification circuit, wherein a respective additional write modification circuit of the one or more additional write modification circuits is connected between a corresponding memory cell of the one or more additional memory cells and the control line.

14. The memory cell arrangement according to claim 1, further comprising:
    one or more additional memory cells, wherein each of the one or more additional memory cells is configured in accordance with the memory cell; and
    a control line connected to the memory cell and each of the one or more additional memory cells, wherein the write modification circuit is connected to the memory cell and each of the one or more additional memory cells via the control line.

15. The memory cell according to claim 1, wherein the spontaneously-polarizable capacitor has an effective capacitance area equal to or less than about one $\mu m^2$.

16. A memory cell arrangement, comprising:
    a memory cell comprising:
        a field-effect transistor comprising a gate terminal, a first source/drain terminal, and a second source/drain terminal, and
        a spontaneously-polarizable capacitor connected to the first source/drain terminal of the field-effect transistor, the spontaneously-polarizable capacitor having a corresponding capacitance; and
        a write modification circuit electrically conductively connected to the second source/drain terminal or the spontaneously-polarizable capacitor, wherein the write modification circuit comprises:
            a plurality of write capacitors, wherein each write capacitor of the plurality of write capacitors has a respective capacitance,
            wherein the write modification circuit is configured to select one or more write capacitors of the plurality of write capacitors to provide an effective write capacitance when the memory cell is written.

17. The memory cell arrangement according to claim 16, wherein the write modification circuit is configured to select none of the plurality of write capacitors when the memory cell is read.

18. The memory cell arrangement according to claim 16, wherein the effective write capacitance is an equivalent capacitance of the one or more write capacitors.

19. The memory cell arrangement according to claim 16, wherein at least two write capacitors of the plurality of write capacitors have a respective capacitance different from one another.

20. A method of operating a memory cell which comprises a spontaneously-polarizable capacitor, the method comprising:
    switching between a write-operation mode and a read-operation mode, wherein one or more write capacitors, which are electrically conductively connected in series with the spontaneously-polarizable capacitor, are charged in the write-operation mode and are not charged in the read-operation mode.

* * * * *